US010931145B2

(12) United States Patent
Park et al.

(10) Patent No.: US 10,931,145 B2
(45) Date of Patent: Feb. 23, 2021

(54) WIRELESS POWER RECEIVER

(71) Applicant: Samsung Electronics Co., Ltd., Suwon-si (KR)

(72) Inventors: Sung-Bum Park, Suwon-si (KR); Dong-Zo Kim, Yongin-si (KR); Keum-Su Song, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 829 days.

(21) Appl. No.: 15/138,886

(22) Filed: Apr. 26, 2016

(65) Prior Publication Data

US 2016/0315503 A1 Oct. 27, 2016

(30) Foreign Application Priority Data

Apr. 27, 2015 (KR) ........................ 10-2015-0059127

(51) Int. Cl.

| | |
|---|---|
| ***H05K 1/16*** | (2006.01) |
| ***H02J 50/12*** | (2016.01) |
| ***H02J 7/02*** | (2016.01) |
| ***H02J 50/80*** | (2016.01) |
| ***H02J 50/70*** | (2016.01) |
| ***H05K 1/00*** | (2006.01) |
| *H02J 7/00* | (2006.01) |

(52) U.S. Cl.

CPC .............. *H02J 50/12* (2016.02); *H02J 7/025* (2013.01); *H02J 50/70* (2016.02); *H02J 50/80* (2016.02); *H05K 1/00* (2013.01); *H02J 7/00034* (2020.01); *H05K 1/165* (2013.01); *H05K 2201/10371* (2013.01)

(58) Field of Classification Search

CPC ........... H02J 50/12; H02J 50/80; H02J 50/70; H05K 1/00; H05K 1/165

USPC .......................................................... 307/104

See application file for complete search history.

(56) References Cited

U.S. PATENT DOCUMENTS

| | | | | |
|---|---|---|---|---|
| 7,175,339 | B2 | 2/2007 | Bisig | |
| 8,922,160 | B2 | 12/2014 | Inoue | |
| 2005/0098886 | A1 * | 5/2005 | Pendse | H01L 23/49838 257/738 |

(Continued)

FOREIGN PATENT DOCUMENTS

| | | | |
|---|---|---|---|
| CN | 101523693 | A | 9/2009 |
| CN | 104321928 | A | 1/2015 |

(Continued)

OTHER PUBLICATIONS

European Office Action dated Jan. 31, 2020, issued in European Patent Application No. 16 786 723.3.

(Continued)

*Primary Examiner* — Rexford N Barnie
*Assistant Examiner* — Swarna N Chowdhuri
(74) *Attorney, Agent, or Firm* — Jefferson IP Law, LLP

(57) ABSTRACT

A wireless power receiver is provided. The wireless power receiver includes a substrate partitioned into a first area and a second area neighboring the first area, a circuit portion mounted in the first area of the substrate and including a receiving module, a resonance pattern portion directly provided on at least one surface of the substrate in the second area, and a shield mounted on a surface of the substrate in the second area.

17 Claims, 16 Drawing Sheets

300
340
320
340
Y
331
331
330
330
332
332
Y
360
X
350
360
312a
312
312b
310
311

(56) References Cited

U.S. PATENT DOCUMENTS

| | | | | |
|---|---|---|---|---|
| 2008/0157603 | A1* | 7/2008 | Baarman | H02J 50/90 307/104 |
| 2009/0015197 | A1 | 1/2009 | Sogabe et al. | |
| 2010/0112949 | A1 | 5/2010 | Kim et al. | |
| 2011/0210696 | A1 | 9/2011 | Inoue | |
| 2012/0057322 | A1 | 3/2012 | Waffenschmidt | |
| 2012/0274148 | A1 | 11/2012 | Sung et al. | |
| 2013/0234906 | A1* | 9/2013 | Rosener | H01Q 1/241 343/790 |
| 2014/0125278 | A1 | 5/2014 | Kim et al. | |
| 2014/0266030 | A1* | 9/2014 | Park | H01F 27/34 320/108 |
| 2014/0266546 | A1* | 9/2014 | Mao | H01F 41/046 336/200 |
| 2015/0061399 | A1 | 3/2015 | Song et al. | |
| 2015/0077296 | A1 | 3/2015 | An et al. | |
| 2015/0092374 | A1 | 4/2015 | Isaacs | |
| 2015/0171739 | A1* | 6/2015 | Kamata | G06K 19/07749 307/104 |
| 2016/0013667 | A1* | 1/2016 | Hosotani | H02J 50/40 307/104 |

FOREIGN PATENT DOCUMENTS

| | | | |
|---|---|---|---|
| KR | 10-2010-0050031 | A | 5/2010 |
| KR | 10-2010-0130480 | A | 12/2010 |
| KR | 10-2011-0090698 | A | 8/2011 |
| KR | 10-2013-0009645 | A | 1/2013 |
| KR | 10-1279856 | B1 | 6/2013 |
| KR | 10-2014-0059722 | A | 5/2014 |
| KR | 10-2014-0094275 | A | 7/2014 |
| KR | 10-2015-0027350 | A | 3/2015 |
| WO | 2012-155135 | A2 | 11/2012 |
| WO | 2014-206661 | A1 | 12/2014 |

OTHER PUBLICATIONS

Chinese Office Action dated Nov. 5, 2019, issued in Chinese Patent Application No. 201680024466.2.

* cited by examiner

WIRELESS POWER RECEIVER

CROSS-REFERENCE TO RELATED APPLICATION(S)

This application claims the benefit under 35 U.S.C. § 119(a) of a Korean patent application filed on Apr. 27, 2015 in the Korean Intellectual Property Office and assigned Serial No. 10-2015-0059127, the entire disclosure of which is hereby incorporated by reference.

TECHNICAL FIELD

The present disclosure relates to wireless power receivers.

BACKGROUND

An electronic device may come with various structures for supplying power thereto, one of which is a battery embedded in the electronic device. The battery may be charged via a charging cable while embedded in the electronic device, or may be removed from the electronic device and be charged in a charging pack (called a cradle) or via a charging cable. When a charging cable is directly connected to the electronic device or charging pack, the electronic device or the charging pack must have cable connection terminals for electrical connection to the charging cable. There are proposed devices that may charge a battery wirelessly or via contactless charging. Such wireless charging (or contactless charging) technology, which uses wireless power transfer, may be used for charging electronic devices with rechargeable batteries. For example, an electronic device may be automatically charged when placed on a charging pad without a connection between the charger and the electronic device through a separate connector.

A wireless charger for wireless charging may include a wireless power transmitter and a wireless power receiver respectively in the charging pad and the electronic device. The wireless power transmitter wirelessly transmits power using a power transmitting member, and the wireless power receiver wirelessly receives the power from the wireless power transmitter using a power receiving member. The wireless power receiver may be embedded in the electronic device, and the wireless power transmitter may be included in the charging pad having the electronic device placed thereon.

Such wireless power transmitter or receiver requires a wireless charging resonator for transmitting or receiving power wirelessly and a wireless module for converting or rectifying alternating current (AC) power induced through the wireless charging resonator into direct current (DC) power.

Generally, a wireless charger may include wireless transmitting and receiving modules, having parts required to transmit or receive power on a printed circuit board (PCB), and a wireless charging resonator electrically connected with the wireless transmitting and receiving modules and having a shield separate from the wireless modules.

According to the related art, the electronic device must come with cable connection terminals for connection between the electronic device and an external power cable in order to charge the battery using the external power cable. In other words, the electronic device must have various modules for the cable connection terminals, which require a space for placing the modules of the cable connection terminals.

The cable connection terminals may be provided for data communication as well as charging the battery. Also, the battery charging pack needs to be removed from the electronic device and carried separately for charging the battery. However, frequent connection of the cable for battery charging may damage the cable connection terminals.

As a connection to the internal circuit board of the electronic device is made via the cable connection terminals, dust or other foreign bodies may come in through the cable connection terminals. For example, influx of water may damage the internal modules of the electronic device. Charging the battery using a cradle in a wired manner requires the electronic device to be placed on the cradle, which is an inconvenience for the user. Further, the need of the cradle to be always carried together may deteriorate portability while increasing the risk of loss.

A wireless charger separately includes a first member having a wireless module embedded on a PCB and a second member including a wireless charging resonator and shield on a circuit board separate from the PCB, and as they are electrically connected, a wireless power receiver may be processed. Accordingly, the wireless charger undergoes complicated process operations, consumes a long processing time, and may cause an increase in size due to the heights of the resonator, shield, and parts mounted therein.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide a wireless power receiver with a simplified structure, which may be manufactured with a simplified assembling process and reduced manufacturing costs.

There is also provided a wireless power receiver that may slim down and may enhance the wireless transmitting/receiving effects.

In accordance with an aspect of the present disclosure, a wireless power receiver is provided. The wireless power receiver includes a substrate partitioned into a first area and a second area neighboring the first area, a circuit portion mounted in the first area of the substrate and including a receiving module, a resonance pattern portion directly provided on at least one surface of the substrate in the second area, and a shield mounted on a surface of the substrate in the second area.

In accordance with another aspect of the present disclosure, a wireless power receiver is provided. The wireless power receiver includes a multi-layered substrate, a circuit portion positioned on the substrate, a resonance pattern portion provided on the substrate around the circuit portion and electrically connected with the circuit portion, and a shield provided on the substrate and mounted to neighbor the circuit portion, wherein the substrate may include a circuit portion mount area where the circuit portion is mounted and a resonance pattern mount area neighboring the circuit portion mount area, the resonance pattern portion mounted in the resonance pattern mount area.

According to various embodiments of the present disclosure, in contrast to the wireless power receiver of the related art that separately includes a first member having a wireless module mounted on a printed circuit board (PCB) and a second member including a wireless charging resonator and shield on a board separate from the PCB, a module and resonator may be implemented on a single PCB, leading to a reduced thickness of the shield or other parts, a sufficient room on the electronic device, and a decreased overall thickness of the electronic device.

Further, since the module and resonator may be implemented on a single PCB, leading to a simplified process, a reduced processing time, and cost savings.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, wherein.

Throughout the drawings, like reference numerals will be understood to refer to like parts, components, and structures.

DETAILED DESCRIPTION

Figure 1:
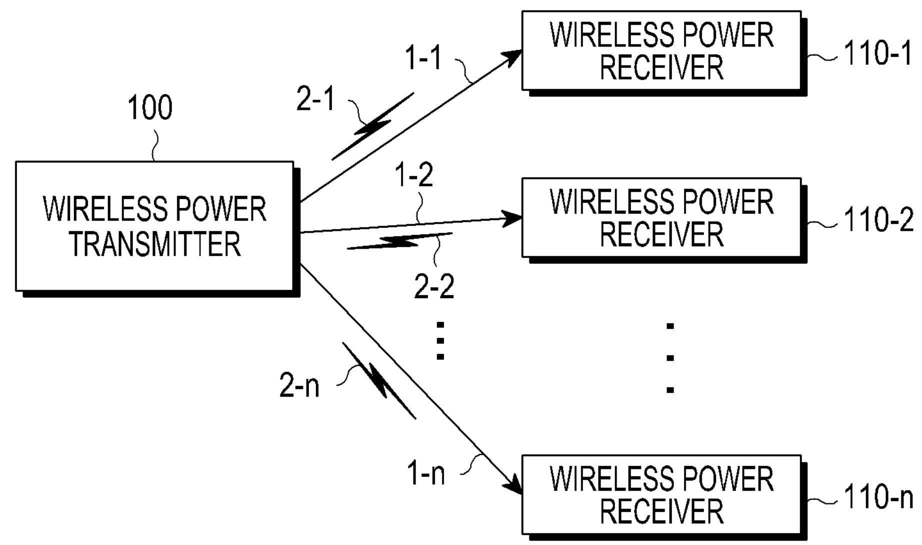
FIG. 1 is a concept view illustrating an operation of a wireless charging system according to an embodiment of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Terms introduced with ordinal numbers such as 'first' and 'second' may be used to denote various components, but the components are not limited by the terms. The terms are used only to distinguish one component from another. For example, a first component may be denoted a second component, and vice versa without departing from the scope of the present disclosure. The term "and/or" may denote a combination(s) of a plurality of related items as listed or any of the items.

The terms "front surface," "rear surface," "upper surface," and "lower surface" are relative ones that may be varied depending on directions in which the figures are viewed, and may be replaced with ordinal numbers such as "first" and "second." The order denoted by the ordinal numbers, first and second, may be varied as necessary.

It will be further understood that the terms "comprise" and/or "have," when used in this specification, specify the presence of stated features, integers, operations, elements, and/or components, but do not preclude the presence or addition of one or more other features, integers, operations, elements, components, and/or groups thereof.

Unless otherwise defined, all terms including technical and scientific terms used herein have the same meaning as commonly understood by one of ordinary skill in the art to which the various embodiments of the present disclosure belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein. In some cases, the terms defined herein may be interpreted to exclude various embodiments of the present disclosure.

As used herein, the term "electronic device" may be any device with a touch panel, and the electronic device may also be referred to as a terminal, a portable terminal, a mobile terminal, a communication terminal, a portable communication terminal, a portable mobile terminal, or a display apparatus.

For example, the electronic device may be a smartphone, a mobile phone, a navigation device, a game device, a television (TV), a head unit for vehicles, a laptop computer, a tablet computer, a portable media player (PMP), or a personal digital assistant (PDA). The electronic device may be implemented as a pocket-sized portable communication terminal with a radio communication function. According to an embodiment of the present disclosure, the electronic device may be a flexible device or a flexible display.

The electronic device may communicate with an external electronic device, e.g., a server, or may perform tasks by interworking with such an external electronic device. For example, the electronic device may transmit an image captured by a camera and/or location information detected by a sensor to a server through a network. The network may include, but is not limited to, a mobile or cellular communication network, a local area network (LAN), a wireless LAN (WLAN), a wide area network (WAN), the Internet, or a small area network (SAN).

Now, the concept of a wireless charging system that may apply to various embodiments of the present disclosure is described with reference to FIGS. 1 to 3.

FIG. 1 is a concept view illustrating an operation of a wireless charging system according to an embodiment of the present disclosure.

Referring to FIG. 1, the wireless charging system includes a wireless power transmitter 100 and at least one wireless power receiver 110-1, 110-2, and **110-*n***.

The wireless power transmitter 100 may wirelessly send power 1-1, 1-2, and **1-*n* to the at least one wireless power receiver 110-1, 110-2, and 110-*n*, respectively. Specifically, the wireless power transmitter 100 may wirelessly transmit the power 1-1, 1-2, and 1-*n*** to a wireless power receiver authenticated by a predetermined authentication process.

The wireless power transmitter 100 may form electrical connections with the wireless power receivers 110-1, 110-2, and **110-*n*. For example, the wireless power transmitter 100 may transmit electromagnetic waves of wireless power to the wireless power receivers 110-1, 110-2, and 110-*n***.

Meanwhile, the wireless power transmitter 100 may perform bi-lateral communication with the wireless power receivers 110-1, 110-2, and **110-*n*. Here, the wireless power transmitter 100 and the wireless power receiver 110-1, 110-2, and 110-*n* may process or communicate packets 2-1, 2-2, and 2-*n*** including predetermined frames. The wireless power receiver may be particularly implemented as a mobile communication terminal, a PDA, a PMP or a smartphone.

The wireless power transmitter 100 may wirelessly provide power to a plurality of wireless power receivers 110-1, 110-2, and **110-*n*. For example, the wireless power transmitter 100 may transmit power to the plurality of wireless power receivers 110-1, 110-2, and 110-*n* through the resonant type. When the wireless power transmitter 100 adopts the resonant type, the distance between the wireless power transmitter 100 and the plurality of wireless power receivers 110-1, 110-2, and 110-*n* may be preferably not more than 30 m. When the wireless power transmitter 100 adopts the electromagnetic inductive type, the distance between the wireless power transmitter 100 and the plurality of wireless power receivers 110-1, 110-2, and 110-*n*** may be preferably 10 cm or less.

The wireless power receivers 110-1, 110-2, and **110-*n* may receive the wireless power from the wireless power transmitter 100 to charge their respective batteries provided therein. The wireless power receivers 110-1, 110-2, and 110-*n* may transmit, to the wireless power transmitter 100, a signal for requesting to transmit wireless power, information necessary to receive wireless power, state information of the wireless power receivers, control information of the wireless power transmitter 100**, etc.

The wireless power receivers 110-1, 110-2, and **110-*n* may transmit to the wireless power transmitter 100 messages that indicate the respective states of the wireless power receivers 110-1, 110-2, and 110-*n***.

The wireless power transmitter 100 may include a display means, such as a display, and may display the respective states of the wireless power receivers 110-1, 110-2, and **110-*n* based on the messages received from the wireless power receivers 110-1, 110-2, and 110-*n*, respectively. Further, the wireless power transmitter 100 may also display the time predicted to be taken until each of the wireless power receivers 110-1, 110-2, and 110-*n*** is completely charged.

The wireless power transmitter 100 may transmit a control signal to disable the wireless charging function to each of the wireless power receivers 110-1, 110-2, and **110-*n*. When receiving the control signal to disable the wireless charging function from the wireless power transmitter 100**, the wireless power receiver may disable the wireless charging function.

Figure 2:
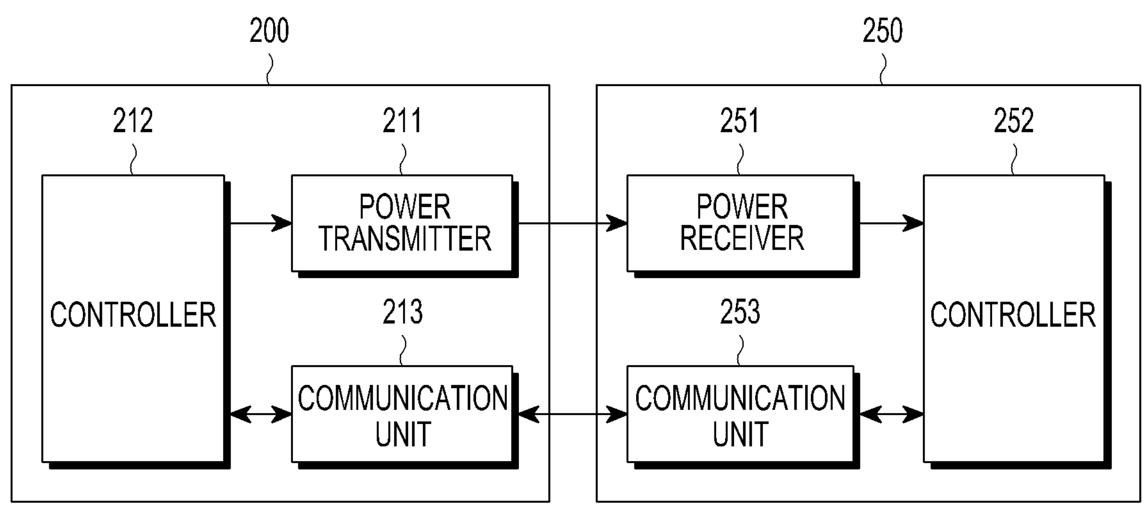
FIG. 2 is a block diagram illustrating a wireless power transmitter and a wireless power receiver according to an embodiment of the present disclosure.

FIG. 2 is a block diagram illustrating a wireless power transmitter and a wireless power receiver according to an embodiment of the present disclosure.

Referring to FIG. 2, the wireless power transmitter 200 may include a power transmitter 211, a controller 212, and a communication unit 213. The wireless power receiver 250 may include a power receiver 251, a controller 252, and a communication unit 253.

The power transmitter 211 may provide power required by the wireless power transmitter 200 and may wirelessly provide power to the wireless power receiver 250. Here, the power transmitter 211 may supply power in the form of an alternating current (AC) waveform or may supply power in the form of a direct current (DC) waveform, convert the same into an AC waveform, and supply the same in the form of an AC waveform. The power transmitter 211 may be implemented in the form of an embedded battery or in the form of a power receiving interface so that it receives power from the outside and supplies the same to other components. It will be appreciated by one of ordinary skill in the art that the power transmitter 211 is not particularly limited as long as it may provide a constant AC waveform of power.

Further, the power transmitter 211 may provide the AC waveform to the wireless power receiver 250 in the form of an electromagnetic wave. The power transmitter 211 may further include a resonant circuit and may transmit or receive a predetermined electromagnetic wave accordingly. When the power transmitter 211 is implemented with a resonant circuit, the inductance L of the loop coil of the resonant circuit may be varied. It will be appreciated by one of ordinary skill in the art that the power transmitter 211 is not particularly limited as long as it may communicate electromagnetic waves.

The controller 212 may control the overall operation of the wireless power transmitter 200. The controller 212 may control the overall operation of the wireless power transmitter 200 using an algorithm, program, or application required for the control read out from a storage unit (not shown). The controller 212 may be implemented in the form of, e.g., a central processing unit (CPU), a microprocessor, or a mini-computer.

The communication unit 213 may communicate with the member 250 via a predetermined scheme. The communication unit 213 may communicate with the communication unit 253 of the wireless power receiver 250 via, e.g., near field communication (NFC), Zigbee communication, infrared (IR) communication, visible light communication, Bluetooth (BT) communication, BT low energy (BLE) communication, etc. The communication unit 213 may use a carrier sense multiple access (CSMA)/collision avoidance (CA) algorithm Meanwhile, the above-enumerated communication schemes are merely examples, and various embodiments of the present disclosure are not limited to a particular communication scheme performed by the communication unit 213.

Meanwhile, the communication unit 213 may transmit a signal of information on the wireless power transmitter 200. Here, the communication unit 213 may unicast, multicast, or broadcast the signal.

Further, the communication unit 213 may receive power information from the wireless power receiver 250. Here, the power information may include at least one of capability, remaining battery, recharge count, usage, battery capability, battery ratio, etc. of the wireless power receiver 250.

Further, the communication unit 213 may transmit a charging function control signal to control the charging function of the wireless power receiver 250. The charging function control signal may be a control signal that enables or disables the charging function by controlling the power receiver 251 of a particular wireless power receiver 250. Further, as described below in greater detail, the power information may include information such as insertion of a wired charging terminal, a switch from an SA mode to an NSA mode, an erroneous condition release, etc.

The communication unit 213 may receive signals from other wireless power transmitters (not shown) as well as from the wireless power receiver 250. For example, the communication unit 213 may receive a Notice signal from other wireless power transmitter.

Although FIG. 2 illustrates that the power transmitter 211 and the communication unit 213 are configured in different hardware components so that the wireless power transmitter 200 performs communication in an out-band manner, this is merely an example.

According to an embodiment of the present disclosure, the power transmitter 211 and the communication unit 213 may be implemented in a single hardware component so that the wireless power transmitter 200 may perform communication in an in-band manner.

The wireless power transmitter 200 and the wireless power receiver 250 may communicate various signals therebetween, so that the subscription of the wireless power receiver 250 to a wireless power network and a charging process through wireless power communication, which are hosted by the wireless power transmitter 200, may be carried out.

Figure 3:
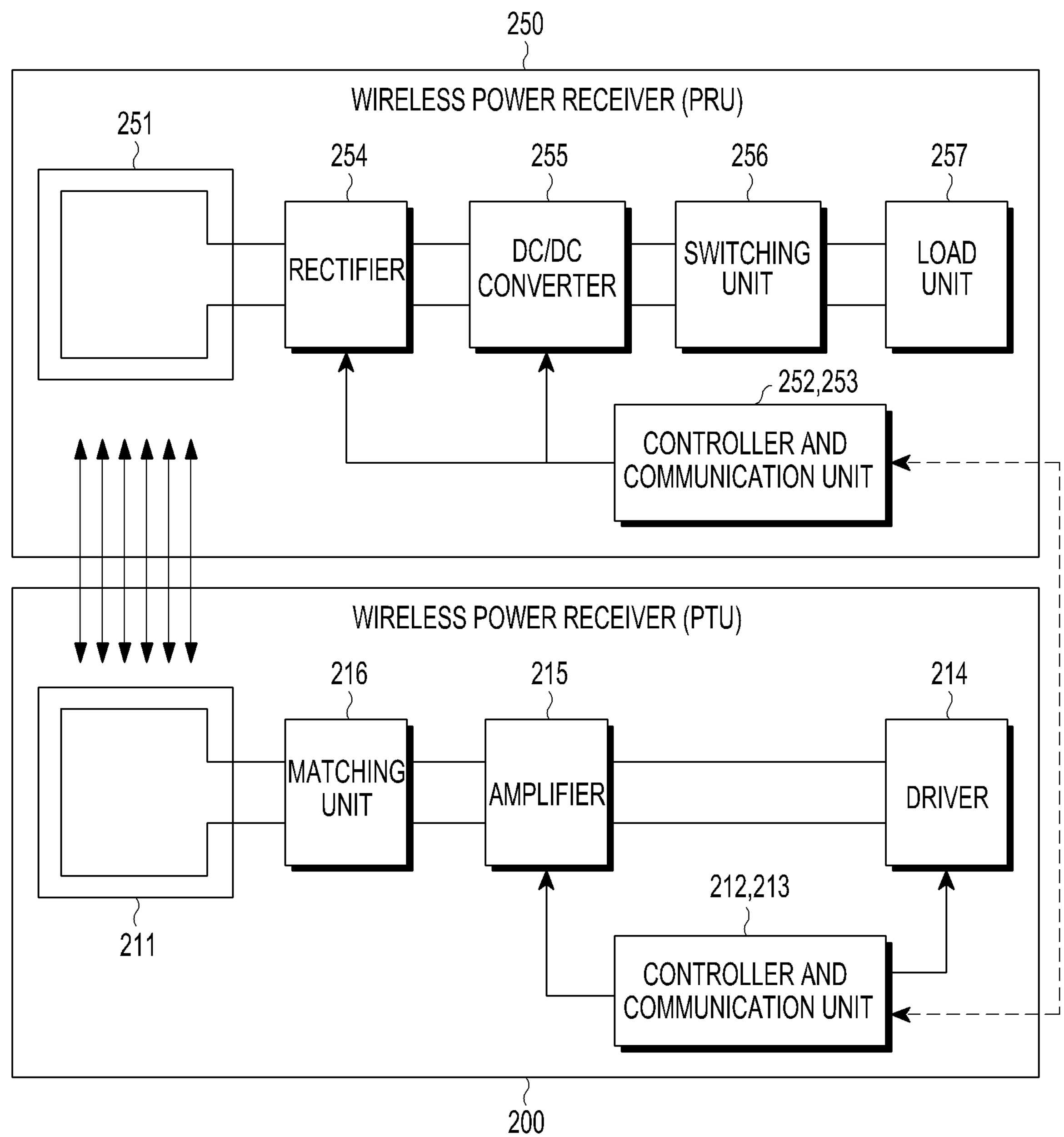
FIG. 3 is a detailed block diagram illustrating a wireless power transmitter and a wireless power receiver according to an embodiment of the present disclosure.

FIG. 3 is a detailed block diagram illustrating a wireless power transmitter and a wireless power receiver according to an embodiment of the present disclosure.

Referring to FIG. 3, the wireless power transmitter 200 may include a power transmitter 211, a controller and communication unit 212 and 213, a driver 214, an amplifier 215, and a matching unit 216. The wireless power receiver 250 may include a power receiver 251, a controller and communication unit 252 and 253, a rectifier 254, a DC/DC converter 255, a switching unit 256, and a load unit 257.

The driver 214 may output DC power with a preset voltage. The voltage of the DC power output from the driver 214 may be controlled by the controller and communication unit 212 and 213.

The DC current output from the driver 214 may be output to the amplifier 215. The amplifier 215 may amplify a DC current with a preset gain. Further, a DC current may be converted into an AC current based on a signal input from the controller and communication unit 212 and 213. Accordingly, the amplifier 215 may output AC power.

The matching unit 216 may perform impedance matching. For example, the impedance viewed from the matching unit 216 may be adjusted to perform control so that the output power shows a higher efficiency or higher output. The matching portion 216 may adjust the impedance under the control of the controller and communication unit 212 and 213. The matching unit 216 may include at least one of a coil and a capacitor. The controller and communication unit 212 and 213 may control the connection with at least one of the coil and the capacitor and may accordingly perform impedance matching.

The power transmitter 211 may transmit the AC power as inputted to the power receiver 251. The power transmitter 211 and the power receiver 251 may be implemented as resonant circuits having the same resonant frequency. For example, the resonant frequency may be determined as 6.78 MHz.

Meanwhile, the controller and communication unit 212 and 213 may perform communication with the controller and communication unit 252 and 253 of the wireless power receiver 250, e.g., bilateral communication (Wi-Fi, ZigBee, or BT/BLE) at 2.4 GHz.

Meanwhile, the power receiver 251 may receive power for charging.

The rectifier 254 may rectify the wireless power received by the power receiver 251 into a DC form and may be implemented in the form of, e.g., bridged diodes. The DC/DC converter 255 may convert the rectified power with a preset gain. For example, the DC/DC converter 255 may convert the rectified power so that the voltage at an output end (not shown) is 5V. Meanwhile, a minimum value and maximum value of the voltage applicable to a front end (not shown) of the DC/DC converter 255 may be previously set.

The switching unit 256 may connect the DC/DC converter 255 with the load unit 257. The switching unit 256 may maintain an on/off status under the control of the controller 252. The load unit 257 may store the converted power input from the DC/DC converter 255 when the switching unit 256 is in an on status.

Figure 4:
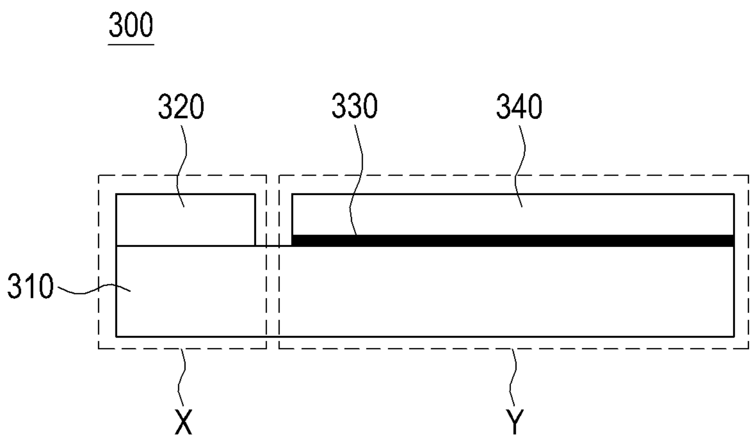
FIG. 4 is a view schematically illustrating a wireless power receiver according to an embodiment of the present disclosure.

FIG. 4 is a view schematically illustrating a wireless power receiver according to an embodiment of the present disclosure.

Referring to FIG. 4, the wireless power receiver 300 may include a substrate 310, a circuit portion, a receiving module 320, a resonance pattern portion 330, and a shield 340.

The substrate 310 may be a printed circuit board (PCB) and may include at least one or more dielectric layers (not shown) and at least one or more metal layers (not shown). The dielectric layer may be formed of flame retardant4 (FR4), polyolefin-based, polyvinyl chloride (PVC)-based, polystyrene-based, polyester-based, polyurethane-based, or polyamide-based insulating material. The metal layer may be stacked on a surface or opposite surface of the dielectric layer or the whole or part of the surface or opposite surface of the dielectric layer. The metal layer may have a plate shape with no patterns. The metal layer may be connected to a ground. The metal layer may be formed of a metal, such as gold, silver, copper, aluminum, iron, or titanium, or an alloy including such metal. The metal layer may have an electric conductance $\sigma$ of $2.38\times10^{6}$S/m or more at 20° c., preferably $3.5\times10^{7}$S/m or more at 20° c. The metal layer 312 may have a thickness of $10^{-7}$ m or more.

The substrate 310 having at least one or more dielectric layers and at least one or more metal layers stacked may be partitioned into two areas respectively having the circuit portion and the resonance pattern portion 330, and accordingly, the receiving module 320 and the resonance pattern portion 330 for wireless charging may be mounted on the single substrate 310.

Figure 5:
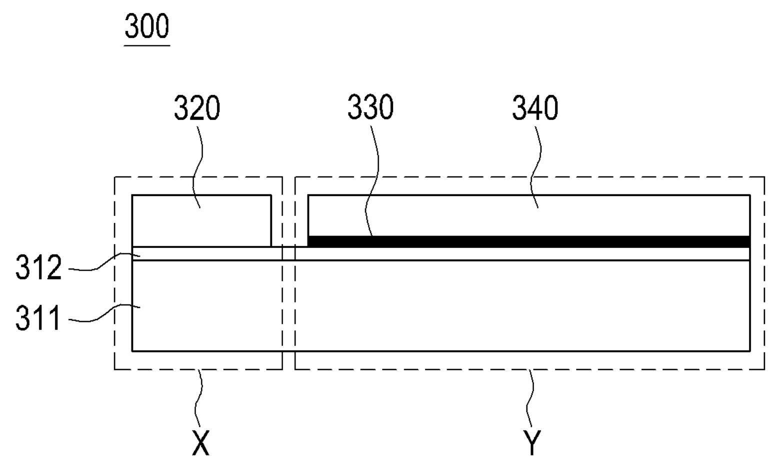
FIG. 5 is a view illustrating an example where a receiving module and a resonance pattern portion are mounted on a substrate having a layered structure in a wireless power receiver according to an embodiment of the present disclosure.
Figure 6:
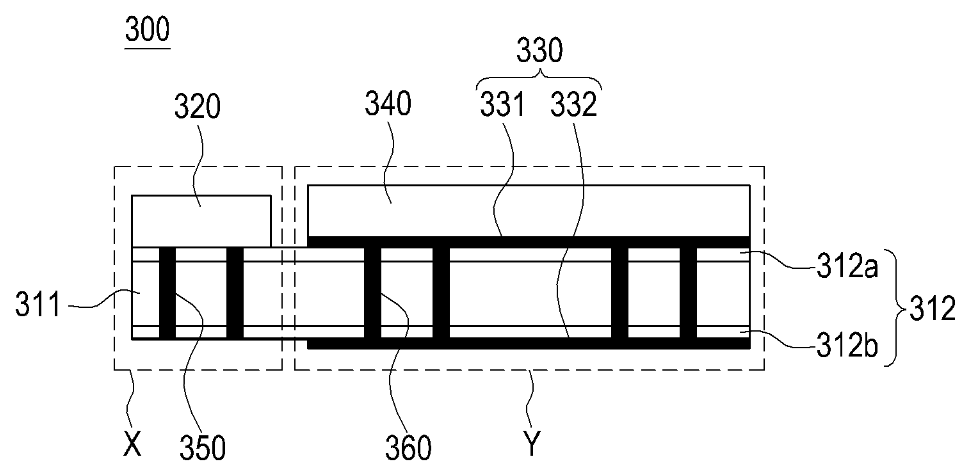
FIG. 6 is a view illustrating an example of a substrate with a two-layered structure where a circuit portion is provided on a surface of the substrate and a resonance pattern portion is mounted on both surfaces of the substrate in a wireless power receiver according to an embodiment of the present disclosure.
Figure 8:
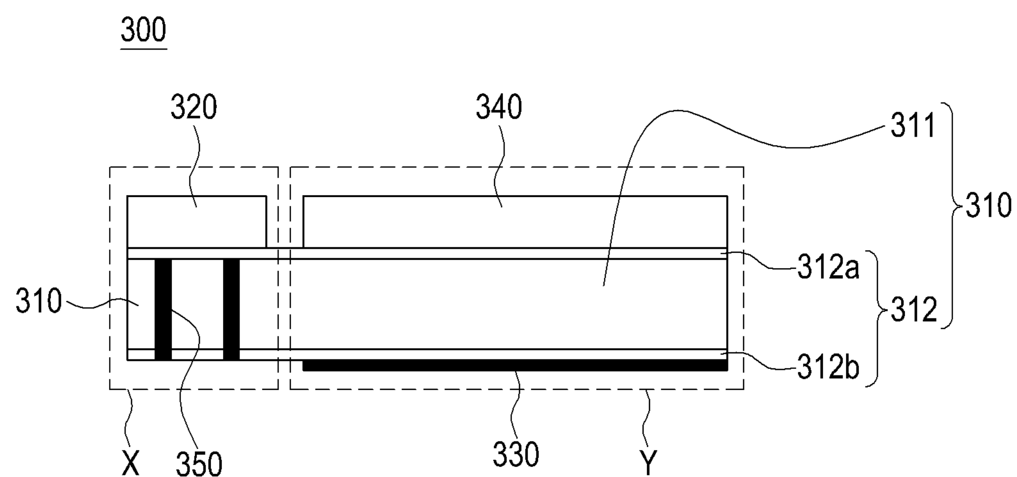
FIG. 8 is a view illustrating an example of a substrate with a two-layered structure where a circuit portion is provided on a first surface of a first area of the substrate and a resonance pattern portion is mounted on a second surface of a second area of the substrate in a wireless power receiver according to an embodiment of the present disclosure.
Figure 10:
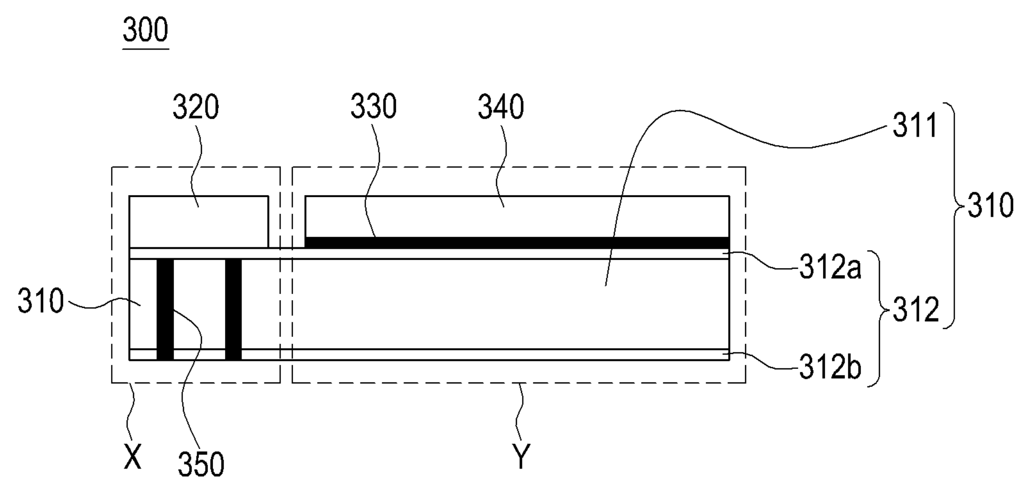
FIG. 10 is a view illustrating an example of a substrate with a two-layered structure where a circuit portion is provided on a first surface of a first area of the substrate and a resonance pattern portion is mounted on a first surface of a second area of the substrate in a wireless power receiver according to an embodiment of the present disclosure.
Figure 11:
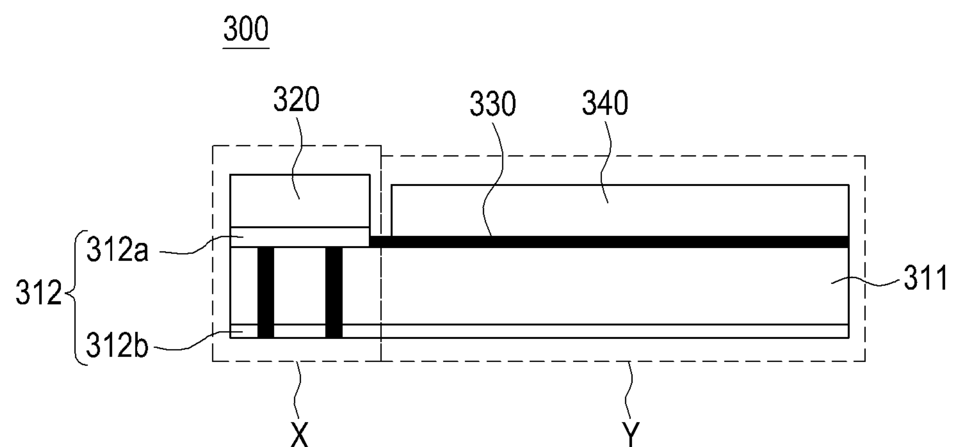
FIG. 11 is a view illustrating an example of a substrate with a two-layered structure where a circuit portion is provided at a side of a first surface of the substrate and a resonance pattern portion is mounted at an opposite side of the first surface of the substrate, with a metal layer removed, in a wireless power receiver according to an embodiment of the present disclosure.
Figure 12:
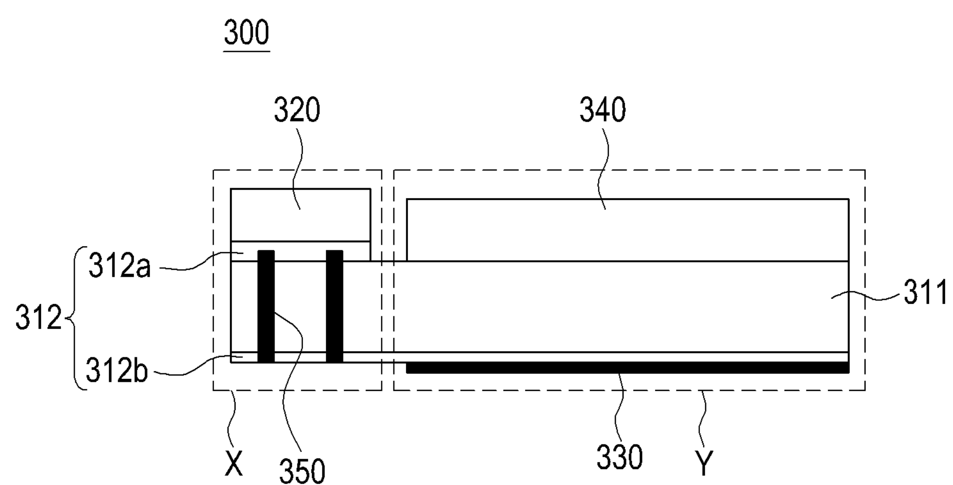
FIG. 12 is a view illustrating an example of a substrate with a two-layered structure where a circuit portion is provided on a first surface of a first area of the substrate and a resonance pattern portion is mounted on a metal layer provided on a second surface of a second area of the substrate in a wireless power receiver according to an embodiment of the present disclosure.

The substrate 310 may be a single-layered substrate 310 or a multi-layered substrate 310 depending on the stacking of the dielectric layers and the metal layers. For example, as shown in FIG. 5, the substrate 310 may have a single-layered structure where one metal layer 312 is stacked on the top of one dielectric layer 311. For example, as shown in FIGS. 6, 8, and 10, the substrate 310 may have a multi-layered structure where two metal layers 312 are stacked on both surfaces of one dielectric layer 311, i.e., on the top and bottom of the dielectric layer 311. As shown in FIGS. 11 and 12, the substrate 310 may have a two-layered structure that includes a first area X formed in a two-layered structure, specifically, one dielectric layer 311 and metal layers 312 disposed on both surfaces of the dielectric layer 311, and a second area Y where no metal layer 312 is formed on one of the top and bottom of the dielectric layer 311 so that the metal layer 312 is formed on only one surface of the dielectric layer 311. As shown in FIGS. 11 and 12, the substrate 310 may have a two-layered structure that includes a first area X formed in a two-layered structure where one dielectric layer 311 is provided and metal layers 312 are disposed on both surfaces of the dielectric layer 311, and a second area Y where no metal layer 312 is formed on one of the top and bottom of the dielectric layer 311 so that the metal layer 312 is formed on only one surface of the dielectric layer 311.

Figure 27:
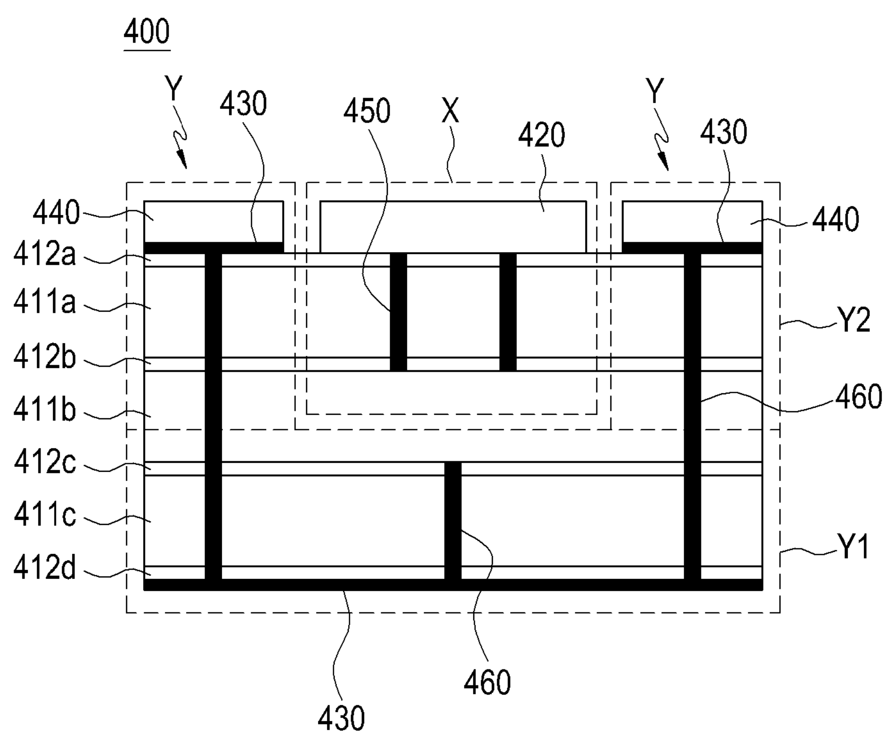
FIG. 27 is a cross-sectional view illustrating a wireless power receiver having a multi-layered substrate, a circuit portion mount area, and a resonance pattern mount area according to an embodiment of the present disclosure.
Figure 28:
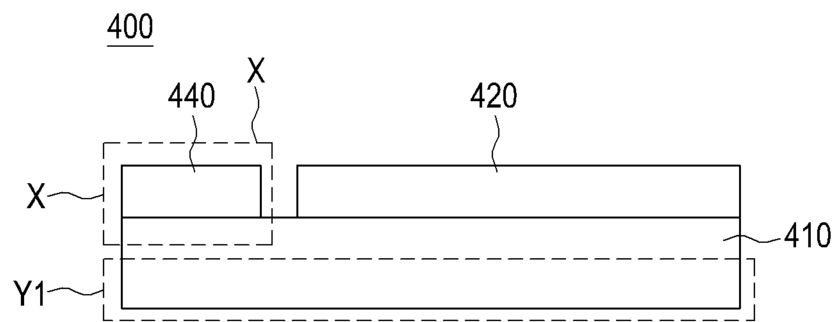
FIG. 28 is a view schematically illustrating a wireless power receiver having a multi-layered substrate, a circuit portion mount area, and a resonance pattern mount area according to an embodiment of the present disclosure.
Figure 29:
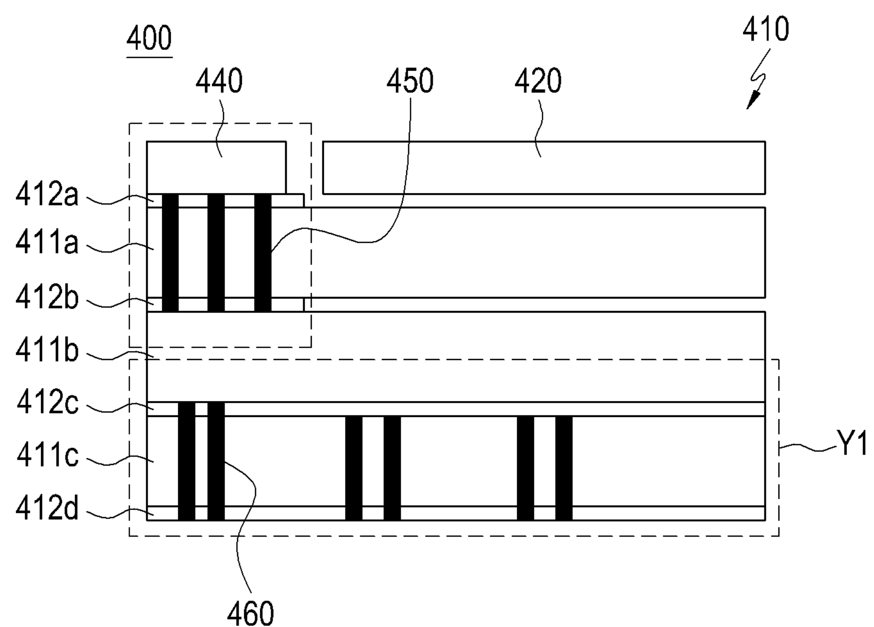
FIG. 29 is a cross-sectional view illustrating a wireless power receiver having a multi-layered substrate, a circuit portion mount area, and a resonance pattern mount area according to an embodiment of the present disclosure.
Figure 30:
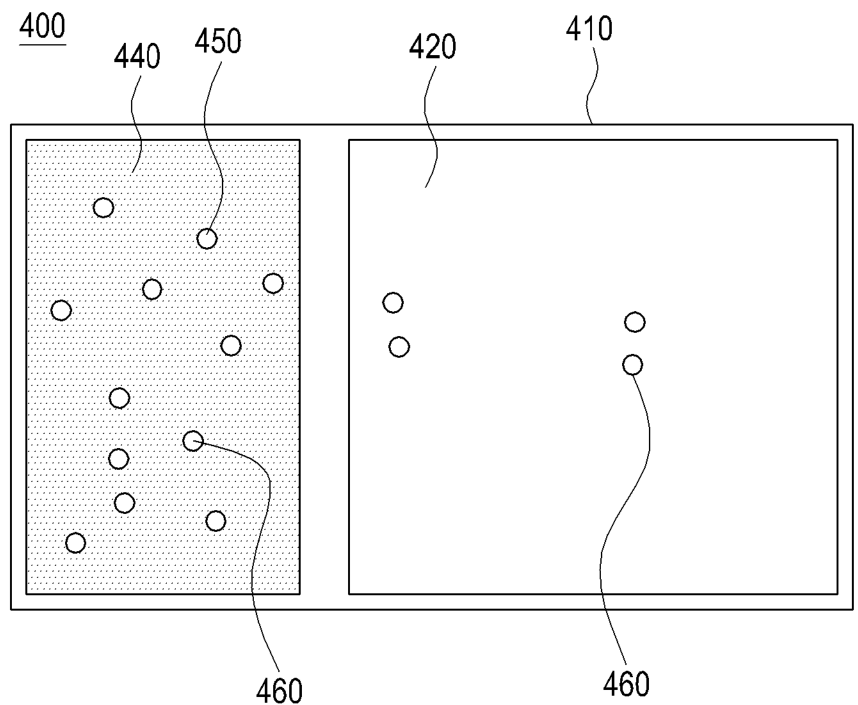
FIG. 30 is a plan view schematically illustrating a wireless power receiver having a multi-layered substrate, a circuit portion mount area, and a resonance pattern mount area according to an embodiment of the present disclosure.
Figure 31:
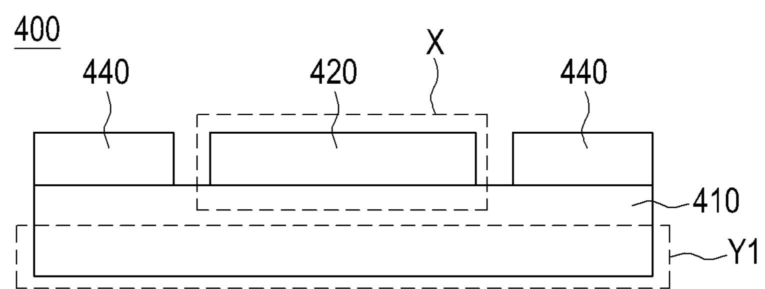
FIG. 31 is a view schematically illustrating a wireless power receiver having a multi-layered substrate, a circuit portion mount area, and a resonance pattern mount area according to an embodiment of the present disclosure.
Figure 32:
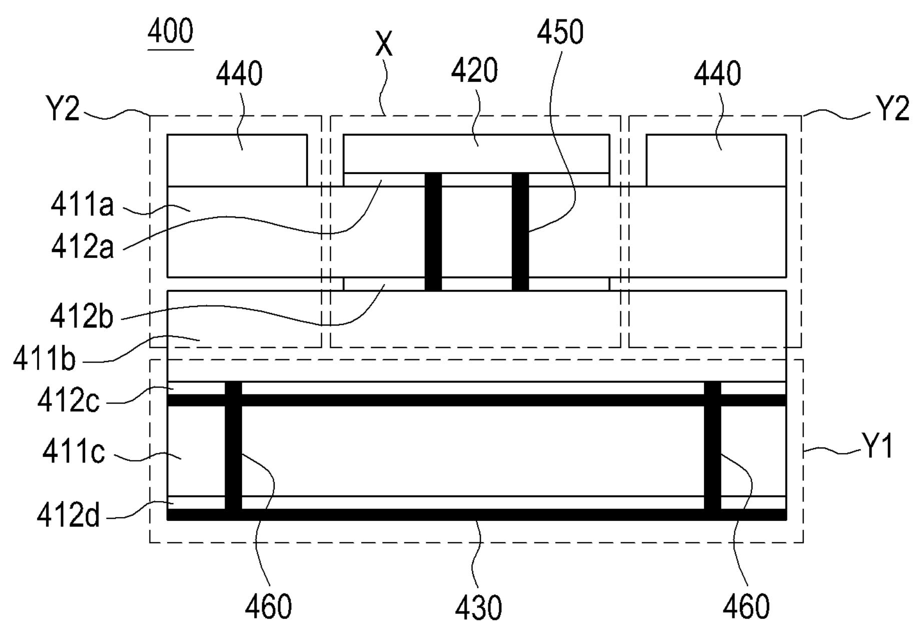
FIG. 32 is a cross-sectional view illustrating a wireless power receiver having a multi-layered substrate, a circuit portion mount area, and a resonance pattern mount area according to an embodiment of the present disclosure.

As shown in FIGS. 23 to 32, the substrate may have a multi-layered structure where a plurality of dielectric layers (in this embodiment, three dielectric layers) are provided, and a plurality of metal layers are provided on the dielectric layers, respectively. For example, as shown in FIGS. 29 and 32, the substrate may be provided in a four-layered structure that includes a first area X formed in a four-layered structure that includes three dielectric layers and four metal layers formed on the tops and bottoms of the three dielectric layers, and a second area Y where no metal layers are formed on both surfaces of the uppermost dielectric layer while the metal layers are formed on both surfaces of only the lowermost dielectric layer.

According to an embodiment of the present disclosure, the substrate may include a first area X where an electronic part, such as the receiving module, is provided, and a second area Y that is positioned adjacent to the first area X and has the resonance pattern portion mounted therein. According to an embodiment of the present disclosure, a structure in which the first area X and the second area Y are implemented at two opposite sides, respectively, of the substrate 310 and a structure in which the first area X and the second area Y are implemented at the center and surrounding portion, respectively, of the substrate 310 are described as an example.

The shield may be mounted on the top of the substrate in the second area Y to shield magnetic fields generated by noise or eddy current for stable operation when power is applied to the resonance pattern portion. The shield may be implemented in the form of a film or may be formed of a material with higher permeability and low loss characteristics.

Hereinafter, an example in which the first area X and the second area Y are implemented at two opposite sides, respectively, of the substrate and the substrate is formed in a single-layered structure is described with reference to FIG. 5.

FIG. 5 is a view illustrating an example where a receiving module and a resonance pattern portion are mounted on a substrate having a layered structure in a wireless power receiver according to an embodiment of the present disclosure.

Referring to FIG. 5, as mentioned above, the substrate 310 may be a single-layered substrate 310 or multi-layered substrate 310 depending on how dielectric layer(s) 311 and metal layer(s) 312 are stacked.

According to an embodiment of the present disclosure, the substrate 310 may have a single-layered structure, and the substrate may be provided with one dielectric layer 311 and one metal layer 312 formed on the dielectric layer 311. The substrate 310 having the dielectric layer 311 and the metal layer 312 formed on the top of the dielectric layer 311 may be partitioned into a first area X and a second area Y positioned adjacent to the first area X.

The first area X may be an area at a first side of the substrate 310, and a circuit portion including the receiving module 320 may be provided in the first area X. The second area Y may be an area at an adjacent, opposite side of the first side of the substrate 310, and the metallic, resonance pattern portion 330 may be patterned on the second area Y. According to an embodiment of the present disclosure, the circuit portion may be mounted on a surface of the substrate 310 in the first area X, specifically, the top surface thereof, and the resonance pattern portion 330 may be mounted on a surface of the substrate 310 in the second area Y, specifically, the top surface thereof.

The circuit portion may be an electronic part including the receiving module 320 and may be a component that may be electrically connected with the substrate 310, specifically, a surface of the substrate 310, or the top surface of the metal layer 312 in the first area X.

The resonance pattern portion 330 may be implemented on a surface of the substrate 310, such as a surface of the metal layer 312 in this embodiment. The resonance pattern portion 330 may be an antenna pattern capable of receiving wireless power and may be formed as a conductive line(s) with a preset pattern such as a loop or spiral, and although not shown, each conductive line may have a predetermined line width. The resonance pattern portion 330 may be formed of a predetermined pattern of a metal, such as gold, silver, copper, an alloy, etc.

The shield 340 may be mounted on the top of the substrate 310 with a thickness that measures the height of the electronic part, such as the receiving module 320.

According to an embodiment of the present disclosure, although an example is described in which the substrate 310 has a single-layered structure while the circuit portion is provided in the first area X at a side of the substrate 310, and the resonance pattern portion 330 is provided in the second area Y at an opposite side of the substrate 310, the stacked structure of the substrate 310 is not limited thereto.

For example, when the substrate 310 has a structure of two or more layers, i.e., a multi-layered structure, the circuit portion may be provided in the first area X at a side of the substrate 310, and at least one or more resonance pattern portions 330 may be provided in the second area Y at an opposite side of the substrate 310. In such case, there may be provided a via hole electrically connected with the circuit portion and allowing for electrical connection of the resonance pattern portions 330 provided on at least one or more layers.

As described above, one substrate 310 may be provided, the circuit portion having the receiving module 320 electrically connected with the resonance pattern portion 330 may be mounted at a side on a surface of the substrate 310, and the resonance pattern portion 330 may be mounted at an opposite side on the surface of the substrate 310. Thus, the process for the wireless power receiver 300 may be done on the single substrate 310. Further, the shield 340 may be mounted with the height of the electronic part such as the receiving module 320 implemented on the circuit portion.

Figure 7:
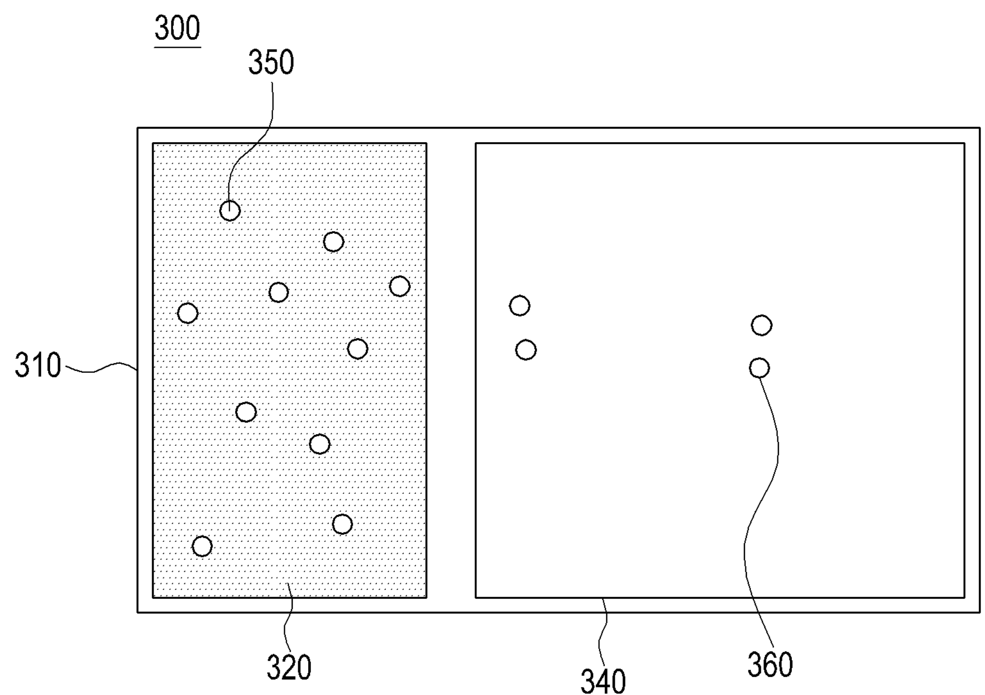
FIG. 7 is a plan view schematically illustrating a wireless power receiver having a substrate with a two-layered structure in a wireless power receiver according to an embodiment of the present disclosure.

Hereinafter, an example in which the first area X and the second area Y are implemented at two opposite sides, respectively, of the substrate 310 and the substrate 310 has a two-layered structure is described with reference to FIGS. 6 to 12. FIGS. 6 and 7 are views illustrating an example where a resonance pattern portion is provided on both surfaces of a substrate, and FIGS. 8 to 12 are views illustrating an example where a resonance pattern portion is provided on a surface of a substrate. Further, the above description applies to the same structure or configuration given above.

FIG. 6 is a view illustrating an example of a substrate with a two-layered structure where a circuit portion is provided on a surface of the substrate and a resonance pattern portion is mounted on both surfaces of the substrate in a wireless power receiver according to an embodiment of the present disclosure.

FIG. 7 is a plan view schematically illustrating a wireless power receiver having a substrate with a two-layered structure in a wireless power receiver according to an embodiment of the present disclosure.

Referring to FIGS. 6 and 7, the substrate 310 may have a multi-layered structure, specifically a two-layered structure. The substrate 310 may have one dielectric layer 311 and metal layers 312 formed on both surfaces, respectively, of the dielectric layer 311 (in this embodiment, the top and bottom of the dielectric layer 311 or first and second surfaces of the dielectric layer 311, and the metal layer 312 formed on the top of the dielectric layer 311 is referred to as a first metal layer 312*a* and the metal layer 312 formed on the bottom of the dielectric layer 311 is referred to as a second metal layer 312*b*).

As described above, the substrate 310 may be partitioned into two areas, specifically, a first area X corresponding to a side of the substrate 310, and a second area Y positioned adjacent to the first area X and corresponding to an opposite side of the substrate 310.

The circuit portion may be mounted in the first area X, specifically on the first metal layer 312*a* in the first area X.

The resonance pattern portion 330 may include a first resonance pattern 331 mounted on the first metal layer 312*a* in the second area Y and a second resonance pattern 332 mounted on the second metal layer 312*b* in the second area Y.

At least one or more first via holes 350 may be formed through the dielectric layer 311 in the first area X to electrically connect a first surface of the substrate 310 with a second surface of the substrate 310, which is an opposite surface of the first surface. The circuit portion may be disposed on both the top and bottom of the first area X.

At least one or more second via holes 360 may be provided through the dielectric layer 311 in the second area Y to electrically connect a first surface of the second area Y with a second surface of the second area Y, which is an opposite surface of the first surface, specifically the first metal layer 312*a*, the first resonance pattern 331 provided on the first metal layer 312*a*, the second metal layer 312*b*, and the second resonance pattern 332 provided on the second metal layer 312*b*.

The shield 340 may be provided on the first metal layer 312*a* to shield magnetic fields generated by noise or eddy current for stable operation when power is applied to the first and second resonance patterns 311 and 312. The shield 340 may be implemented in the form of a film or may be formed of a material with higher permeability and low loss characteristics.

As described above, the circuit portion having the receiving module 320 electrically connected with the resonance pattern portion 330 may be mounted at a side on a surface of the substrate 310, and the resonance pattern portion 330 may be mounted at an opposite side on two opposite surfaces of the substrate 310. Thus, the wireless power receiver 300 may be formed on the single substrate 310. Further, the shield 340 may be mounted with the height of the electronic part such as the receiving module 320 implemented on the circuit portion.

Hereinafter, an example in which the resonance pattern portion 330 is positioned on at least one of a first surface of the dielectric layer 311 or a second surface of the dielectric layer 311, which is an opposite surface of the first surface, is described with reference to FIGS. 8 to 12.

FIG. 8 is a view illustrating an example of a substrate with a two-layered structure where a circuit portion is provided on a first surface of a first area X of the substrate and a resonance pattern portion is mounted on a second surface of a second area Y of the substrate in a wireless power receiver according to an embodiment of the present disclosure.

Figure 9:
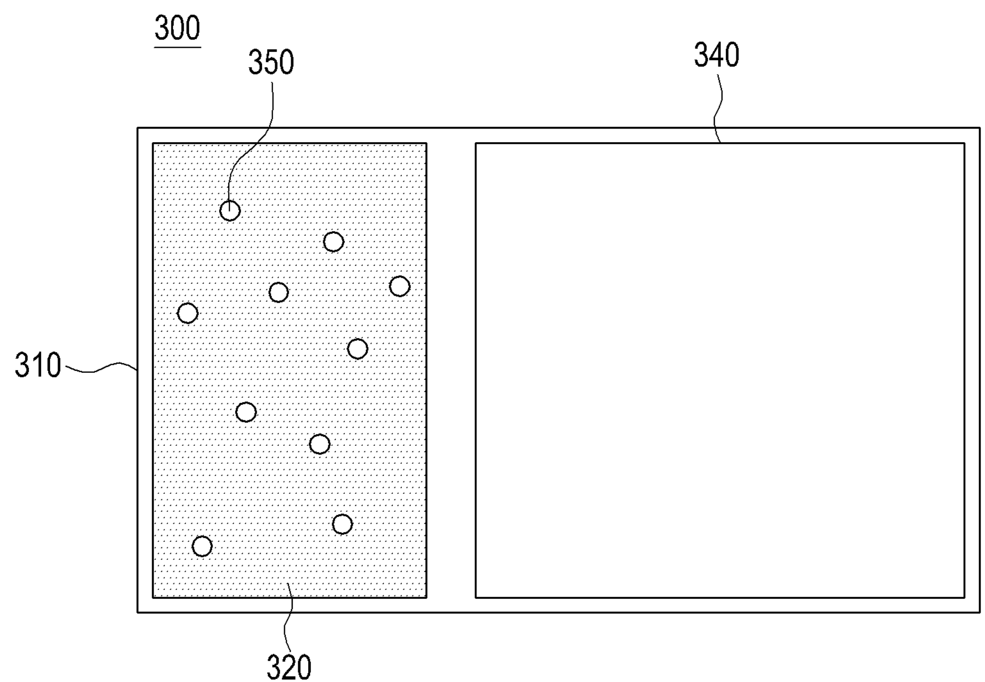
FIG. 9 is a plan view schematically illustrating a wireless power receiver according to an embodiment of the present disclosure.

FIG. 9 is a plan view schematically illustrating a wireless power receiver according to an embodiment of the present disclosure.

Referring to FIGS. 8 and 9, as described above in connection with FIG. 6, the substrate 310 may have a multi-layered structure, specifically a two-layered structure. The substrate 310 may have one dielectric layer 311 and metal layers 312 formed on both surfaces, respectively, of the dielectric layer 311 (in this embodiment, the top and bottom of the dielectric layer 311 or first and second surfaces of the dielectric layer 311, and the metal layer 312 formed on the top of the dielectric layer 311 is referred to as a first metal layer 312*a* and the metal layer 312 formed on the bottom of the dielectric layer 311 is referred to as a second metal layer 312*b*). Further, the substrate 310 may be partitioned into two areas, specifically, a first area X corresponding to a side of the substrate 310, and a second area Y positioned adjacent to the first area X and corresponding to an opposite side of the substrate 310.

Further, according to an embodiment of the present disclosure, the substrate 310 may be partitioned into a first area X and a second area Y positioned adjacent to the first area X. The circuit portion may be mounted in the first area X, specifically on the first metal layer 312*a* in the first area X.

According to an embodiment of the present disclosure, the resonance pattern portion 330 may be provided on a second surface of the substrate 310, which is an opposite surface of the first surface of the substrate 310, specifically on the second metal layer 312*b* in the second area Y of the substrate 310. Further, as the second metal layer 312*b* and the resonance pattern portion 330 are positioned at a lower portion of the substrate 310, a first via hole 350 may be implemented in the first area X to connect together the top and bottom of the substrate 310 so as to electrically connect with the circuit portion having the receiving module 320.

Further, the shield 340 may be provided on the first metal layer 312*a* to shield magnetic fields generated by noise or eddy current for stable operation when power is applied to the resonance pattern portion 330. The shield 340 may be implemented in the form of a film or may be formed of a material with higher permeability and low loss characteristics.

FIG. 10 is a view illustrating an example of a substrate with a two-layered structure where a circuit portion is provided on a first surface of a first area X of the substrate and a resonance pattern portion is mounted on a first surface of a second area Y of the substrate in a wireless power receiver according to an embodiment of the present disclosure.

Referring to FIG. 10, as described above in connection with FIG. 8, the substrate 310 may have a multi-layered structure, specifically a two-layered structure. The substrate 310 may have one dielectric layer 311 and metal layers 312 formed on both surfaces, respectively, of the dielectric layer 311 (in this embodiment, the top and bottom of the dielectric layer 311, two opposite surfaces, or first and second surfaces of the dielectric layer 311, and the metal layer 312 formed on the top of the dielectric layer 311 is referred to as a first metal layer 312*a* and the metal layer 312 formed on the bottom of the dielectric layer 311 is referred to as a second metal layer 312*b*). Further, the substrate 310 may be partitioned into two areas, specifically, a first area X corresponding to a side of the substrate 310, and a second area Y positioned adjacent to the first area X and corresponding to an opposite side of the substrate 310.

However, a difference from the wireless power receiver 300 described above in connection with FIG. 8 lies in the position where the resonance pattern portion 330 is mounted. In other words, according to an embodiment of the present disclosure, the circuit portion may be mounted in the first area X in the first surface of the substrate 310, specifically on the first metal layer 312*a* in the first area X of the substrate 310. Further, according to an embodiment of the present disclosure, the resonance pattern portion 330 may be provided on the first surface of the substrate 310, specifically on the first metal layer 312*a* in the second area Y of the substrate 310. Further, a first via hole 350 may be implemented in the first area X to connect together the top and bottom of the substrate 310 so as to electrically connect the circuit portion with the parts mounted on the second metal layer 312*b* in the first area X.

Further, the shield 340 may be provided on the first metal layer 312*a* to shield magnetic fields generated by noise or eddy current for stable operation when power is applied to the resonance pattern portion 330. The shield 340 may be implemented in the form of a film or may be formed of a material with higher permeability and low loss characteristics.

FIG. 11 is a view illustrating an example of a substrate with a two-layered structure where a circuit portion is provided at a side of a first surface of the substrate and a resonance pattern portion is mounted at an opposite side of the first surface of the substrate, with a metal layer removed, in a wireless power receiver according to an embodiment of the present disclosure.

Referring to FIG. 11, the substrate 310 may have a multi-layered structure, specifically a two-layered structure, as described above in connection with FIG. 6, and the substrate 310 may include a dielectric layer 311 and a metal layer 312. Particularly in the instant embodiment, the substrate 310 may have one dielectric layer 311. Further, the metal layers 312 may be provided on both surfaces in the first area X positioned at a side of the substrate 310, and the metal layer 312 may be provided to be mounted on only one surface or opposite surface (in this embodiment, the bottom or opposite surface) in the second area Y of the substrate 310. In other words, the metal layer 312 stacked on the top of the substrate 310 in the second area Y may be removed, so that the metal layer 312 may be provided on only the top of the substrate 310 in the first area X of the substrate 310.

Specifically, a look at the top of the substrate 310 shows that the first metal layer 312*a* may be provided in the first area X, and the first metal layer 312*a* may be removed from the second area Y to expose the top surface of the dielectric layer 311. In this condition, the resonance pattern portion 330 may be immediately patterned on the top of the dielectric layer 311 in the second area Y where the first metal layer 312*a* has been removed.

A look at the bottom of the substrate 310 shows that the second metal layer 312*b* may be formed in the first area X and the second area Y.

Further, according to an embodiment of the present disclosure, the substrate 310 may be partitioned into a first area X and a second area Y positioned adjacent to the first area X. The circuit portion may be mounted in the first area X, specifically on the first metal layer 312*a* in the first area X.

As set forth above, according to an embodiment of the present disclosure, the resonance pattern portion 330 may be right patterned on the first surface of the dielectric layer 311 where the first metal layer 312*a* has been removed from the second area Y.

The first via hole 350 may be provided through the dielectric layer 311 in the first area X to electrically connect the top and bottom of the substrate 310 in order to allow for electrical connection between the circuit portion and the electronic parts implemented on the second metal layer 312*b* on the bottom surface of the substrate 310.

The shield 340 may be provided on the first metal layer 312*a* to shield magnetic fields generated by noise or eddy current for stable operation when power is applied to the first and second resonance patterns 331 and 332. The shield 340 may be implemented in the form of a film or may be formed of a material with higher permeability and low loss characteristics.

FIG. 12 is a view illustrating an example of a substrate with a two-layered structure where a circuit portion is provided on a first surface of a first area X of the substrate and a resonance pattern portion is mounted on the metal layer provided on a second surface of a second area Y of the substrate in a wireless power receiver according to an embodiment of the present disclosure.

Referring to FIG. 12, the substrate 310 may have a multi-layered structure, specifically a two-layered structure, as described above in connection with FIG. 11, and the substrate 310 may include a dielectric layer 311 and a metal layer 312. According to an embodiment of the present disclosure, the substrate 310 may be partitioned into a first area X at a side thereof and a second area Y neighboring the first area and positioned at an opposite side thereof. Further, the circuit portion may be mounted in the first area X, specifically on the first metal layer 312*a* in the first area X. Further, a difference from the embodiment described above in connection with FIG. 11 lies in that, with the first metal layer 312*a* removed from the top of the dielectric layer 311, the resonance pattern portion 330 is patterned on the top of the dielectric layer 311 in the above embodiment while in the instant embodiment, the shield 340 is mounted on the top of the dielectric layer 311, and the resonance pattern portion 330 is patterned on the surface of the second metal layer 312*b* in the second area Y.

Specifically, in the instant embodiment, one dielectric layer 311 may be provided, and metal layers 312 may be provided on both surfaces in the first area X positioned at a side of the substrate 310, and the metal layer 312 may be provided to be mounted on only one surface or opposite surface (in this embodiment, the bottom or opposite surface) in the second area Y of the substrate 310. That is, the metal layer 312 stacked on the top of the substrate 310 in the second area Y may be removed so that the metal layer 312 (hereinafter, the "first metal layer 312*a*") may be provided only in the first area X. In other words, a look at the top of the substrate 310 shows that the first metal layer 312*a* may be provided in the first area X, and the first metal layer 312*a* may be removed from the second area Y to expose the top surface of the dielectric layer 311. In this condition, the shield 340 may be provided on the top of the dielectric layer 311 in the second area Y where the first metal layer 312*a* has been removed. The second metal layer 312*b* may be provided on the whole or partial surface in the first area X and second area Y on the bottom of the substrate 310, and the resonance pattern portion 330 may be patterned on the surface of the second metal layer 312*b* in the second area Y, which is stacked on the bottom of the substrate 310, specifically the bottom of the dielectric layer 31.

A circuit portion on the top of the substrate 310 may be electrically connected with a circuit portion providable on the bottom of the substrate 310, and a first via hole 350 may be provided through the dielectric layer 311 in the first area X to electrically connect the top and bottom of the substrate 310 so as to allow for electrical connection between the circuit portion and electronic parts implemented on the second metal layer 312*b* on the bottom surface so that the resonance pattern portion 330 stacked on the bottom of the substrate 310 may be electrically connected with the circuit portion.

Further, as set forth above, the shield 340 may be seated on the top of the dielectric layer 311 in the second area Y to shield magnetic fields generated by noise or eddy current for stable operation when the resonance pattern portion 330 is driven.

Figure 13:
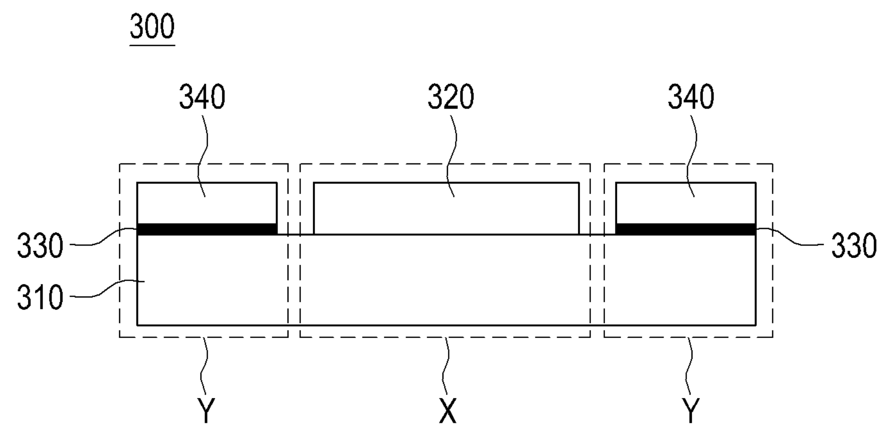
FIG. 13 is a view schematically illustrating a wireless power receiver according to an embodiment of the present disclosure.

FIG. 13 is a view schematically illustrating a wireless power receiver according to an embodiment of the present disclosure.

Figure 14:
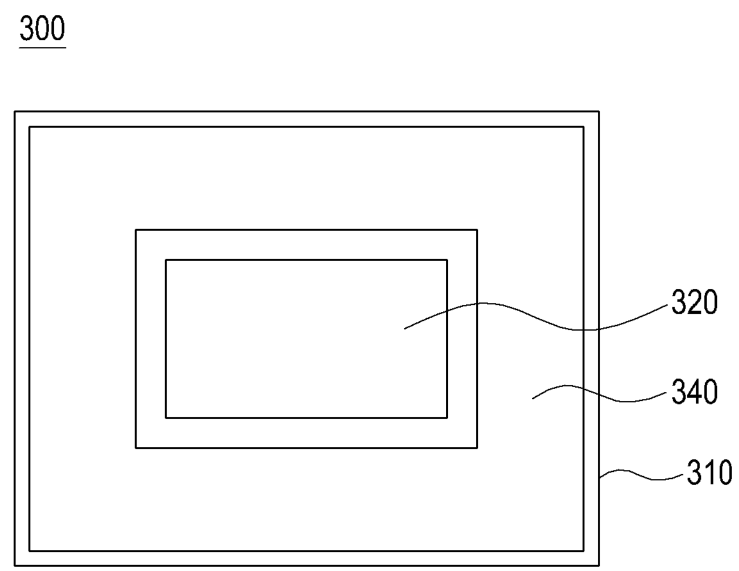
FIG. 14 is a plan view schematically illustrating a wireless power receiver according to an embodiment of the present disclosure.

FIG. 14 is a plan view schematically illustrating a wireless power receiver according to an embodiment of the present disclosure.

Referring to FIGS. 13 and 14, a wireless power receiver 300 may include a substrate 310, a circuit portion, a resonance pattern portion 330, and a shield 340.

The wireless power receiver 300 in the instant embodiment differs from the wireless power receiver 300 described above in connection with FIGS. 4 to 12 in the position of the first area X where the circuit portion is mounted and the second area Y where the resonance pattern portion 330 is mounted.

Specifically, in the wireless power receiver 300 according to the instant embodiment, the substrate 310 may be partitioned into the first area X where the circuit portion is located and the second area Y where the resonance pattern portion 330 is mounted, wherein the first area X is an inside area of the substrate 310, specifically a central area of the substrate 310, and the second area Y is an area around the first area X. That is, a surrounding area of the substrate 310 may be the second area Y where the resonance pattern portion 330 is mounted, and the first area X may be positioned inside the second area Y to have the circuit portion mounted therein.

The substrate 310, the circuit portion, and the resonance pattern portion 330 have been described above, and no repetitive description thereof is given. For example, the substrate 310 having at least one or more dielectric layers 311 and at least one or more metal layers 312 stacked may be partitioned into two areas (however, in the instant embodiment, the two areas differ in position from each other) where the circuit portion and the resonance pattern portion 330, respectively, are provided, and accordingly, a receiving module 320 and resonance pattern portion 330 for wireless charging may be mounted on the single substrate 310.

Figure 15:
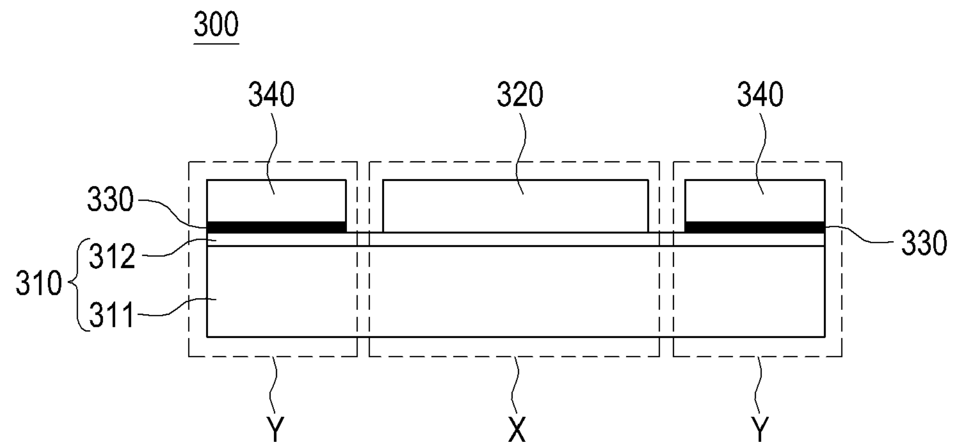
FIG. 15 is a view illustrating an example where a receiving module and resonance pattern portion are mounted on a substrate having a layered structure in a wireless power receiver according to an embodiment of the present disclosure.
Figure 16:
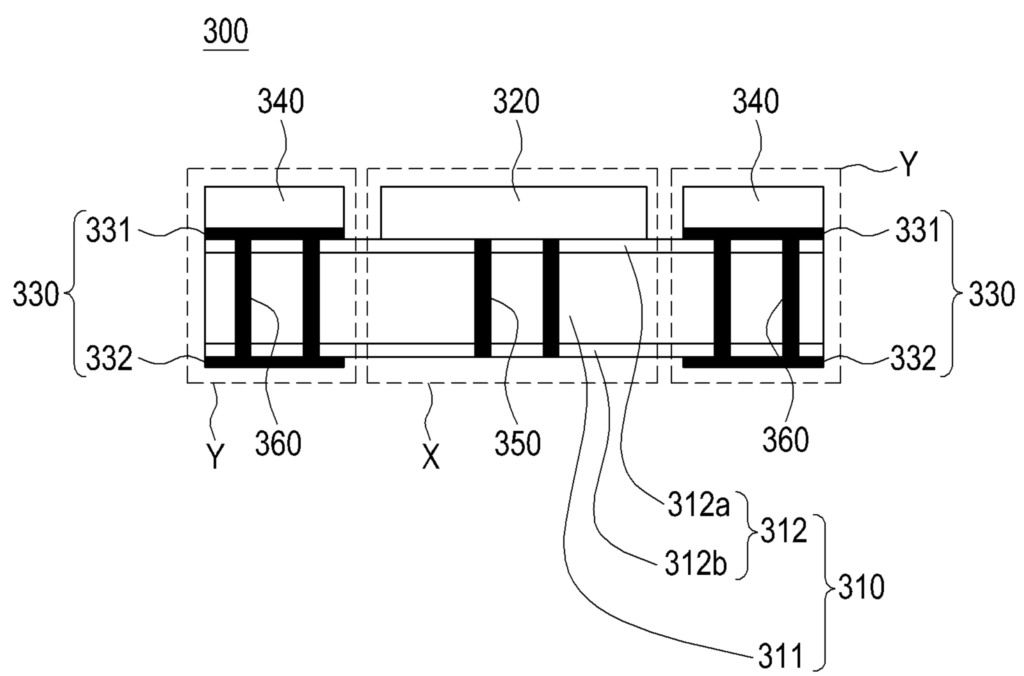
FIG. 16 is a view illustrating an example of a substrate with a two-layered structure where a circuit portion is provided on a first surface of a first area of the substrate and a resonance pattern portion is mounted on both surfaces of a second area of the substrate in a wireless power receiver according to an embodiment of the present disclosure.
Figure 18:
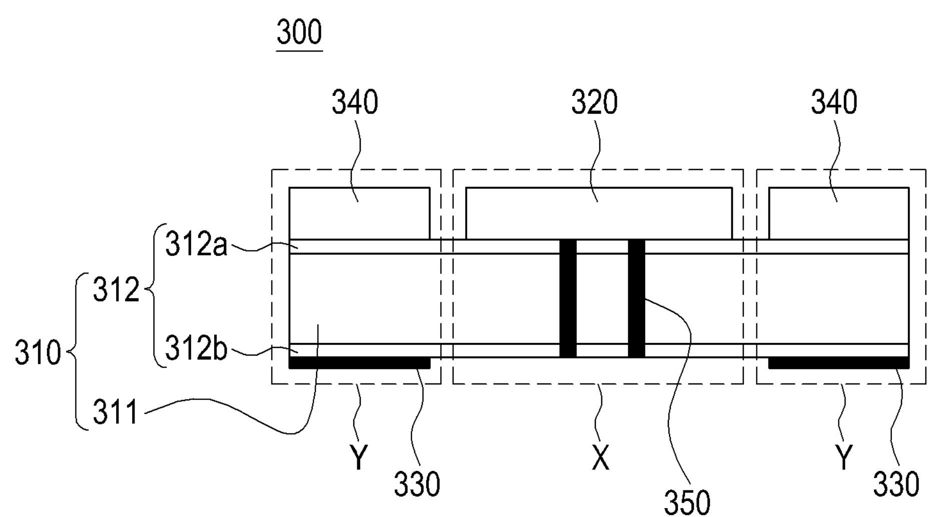
FIG. 18 is a view illustrating an example of a substrate with a two-layered structure where a circuit portion is provided on a first surface of a first area of the substrate and a resonance pattern portion is mounted on a second surface of a second area of the substrate in a wireless power receiver according to an embodiment of the present disclosure.
Figure 19:
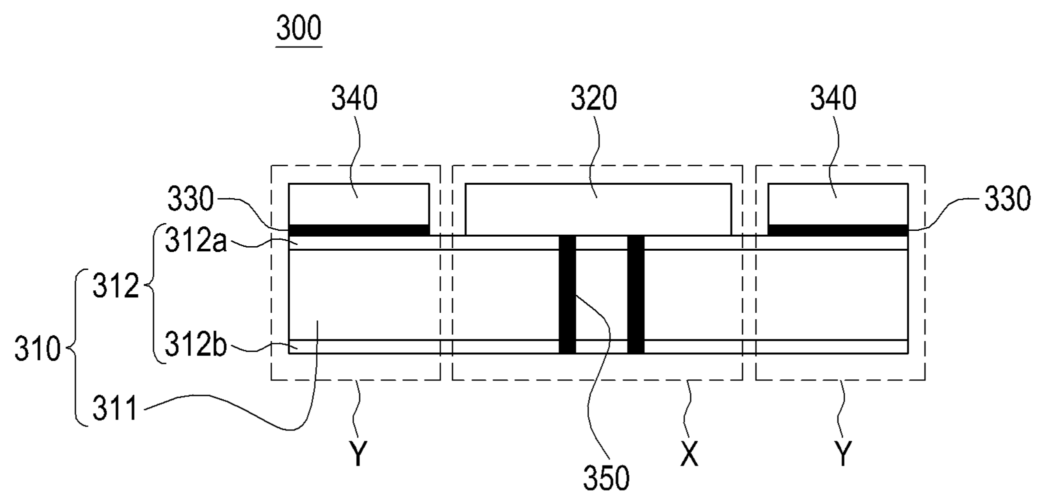
FIG. 19 is a view illustrating an example of a substrate with a two-layered structure where a circuit portion is provided on a first surface of a first area of the substrate and a resonance pattern portion is mounted on a first surface of a second area of the substrate in a wireless power receiver according to an embodiment of the present disclosure.
Figure 21:
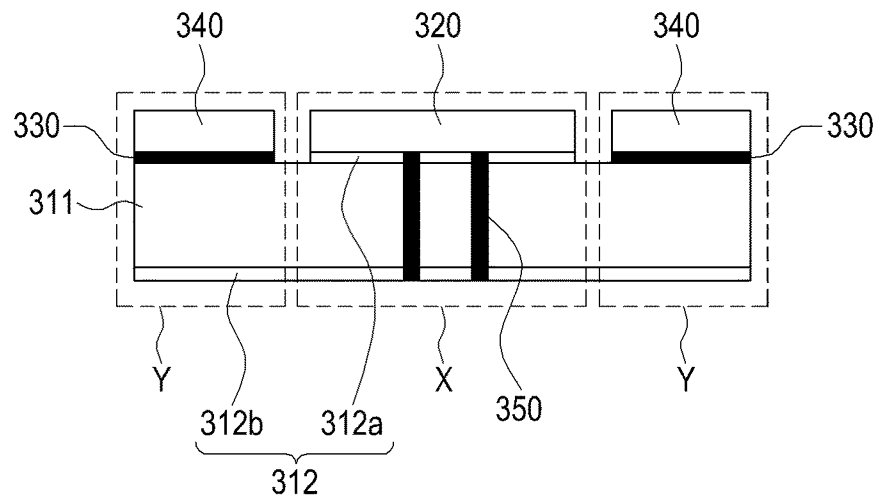
FIG. 21 is a view illustrating an example of a substrate with a two-layered structure where a circuit portion is provided in a first area of a first surface of the substrate and a resonance pattern portion is mounted on the top surface of a dielectric layer in a second area of the first surface of the substrate, with a metal layer removed, in a wireless power receiver according to an embodiment of the present disclosure.
Figure 22:
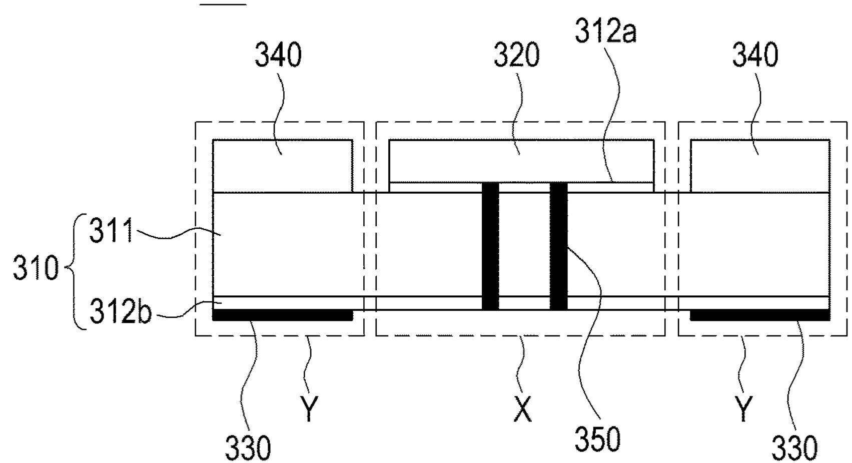
FIG. 22 is a view illustrating an example of a substrate with a two-layered structure where a circuit portion is provided on a first surface of a first area of the substrate and a resonance pattern portion is mounted on a metal layer provided on a second surface of a second area of the substrate in a wireless power receiver according to an embodiment of the present disclosure.

According to an embodiment of the present disclosure, the substrate 300 of the wireless power receiver 300 may be a single-layered substrate 310 and multi-layered substrate 310 depending on the stacking of the dielectric layers 311 and the metal layers 312. For example, as shown in FIG. 15, the substrate 310 may have a single-layered structure where one metal layer 312 is stacked on the top of one dielectric layer 311. For example, as shown in FIGS. 16, 18, and 19, the substrate 310 may have a multi-layered structure where two metal layers 312 are stacked on both surfaces of one dielectric layer 311, i.e., on the top and bottom of the dielectric layer 311. As shown in FIG. 21 or 22, the substrate 310 may have a two-layered structure that includes a first area X formed in a two-layered structure, specifically, where one dielectric layer 311 is provided and metal layers 312 are disposed on both surfaces of the dielectric layer 311, and a second area Y where no metal layer 312 is formed on one of the top and bottom of the dielectric layer 311 so that the metal layer 312 is formed on only one surface of the dielectric layer 311.

According to an embodiment of the present disclosure, in the wireless power receiver, the first area X may be an inside central portion of the substrate 310, and the second area Y may be a surrounding portion around the substrate 310, which is an outer surrounding portion of the first area X, but various embodiments of the present disclosure are not limited thereto. For example, the first area X may be off the center of the substrate 310 in the first area X to a side thereof, and the first area X may be an outside surrounding portion of the second area Y. As such, the position of the first area X and the second area Y may be varied.

Hereinafter, an example in which the first area X and the second area Y are implemented at two opposite sides, respectively, of the substrate 310 and the substrate 310 is formed in a single-layered structure is described with reference to FIG. 15.

FIG. 15 is a view illustrating an example where a receiving module and resonance pattern portion are mounted on a substrate having a layered structure in a wireless power receiver according to an embodiment of the present disclosure.

Referring to FIG. 15, a substrate 310 may be a single-layered substrate 310 or multi-layered substrate 310 depending on how dielectric layer(s) 311 and metal layer(s) 312 are stacked.

According to an embodiment of the present disclosure, the substrate 310 may have a single-layered structure, and the substrate may be provided with one dielectric layer 311 and one metal layer 312 formed on the dielectric layer 311. The substrate 310 having the dielectric layer 311 and the metal layer 312 formed on the top of the dielectric layer 311 may be partitioned into a first area X that is the center of the substrate 310 and has a circuit portion installed therein and a second area Y positioned around the first area X, corresponding to a surrounding area of the substrate 310, and having the resonance pattern portion 330 installed therein. In this embodiment, the circuit portion may be mounted on a first surface (in this embodiment, this corresponds to the top of the substrate 310) of the substrate 310 in the first area X that is the center of the substrate 310, specifically on the top surface of the metal layer 312 stacked on the top of the dielectric layer 311, and the resonance pattern portion 330 may be mounted on a first surface (in this embodiment, this corresponds to the top of the substrate 310) of the substrate 310 in the second area Y that is a surrounding area of the substrate 310, specifically on the top surface of the metal layer 312 stacked on the top of the dielectric layer 311.

The circuit portion may be an electronic part including the receiving module 320 and may be a component that may be mounted in the first area X of the substrate 310, specifically on the first surface of the substrate 310 in the first area X to electrically connect with the top surface of the metal layer 312.

The resonance pattern portion 330 may be implemented on a surrounding portion of the first surface of the substrate 310, specifically on a surrounding portion of the metal layer 312 stacked on the top of the dielectric layer 311. According to an embodiment of the present disclosure, the resonance pattern portion 330 may be an antenna pattern capable of receiving wireless power and may be formed as a conductive line(s) with a preset pattern such as a loop or spiral, and although not shown, each conductive line may have a predetermined line width. The resonance pattern portion 330 may be formed of a predetermined pattern of a metal, such as gold, silver, or copper, or an alloy.

The shield 340 may be mounted on the top of the substrate 310, specifically on the second area Y of the substrate 310 with a thickness that measures the height of the receiving module 320 mounted on the top of the substrate 310 around the receiving module 320.

According to an embodiment of the present disclosure, although an example is described in which the substrate 310 has a single-layered structure while the circuit portion is provided in the first area X that is the central portion of the substrate 310, and the resonance pattern portion 330 is provided in the second area Y at an opposite side of the substrate 310, the stacked structure of the substrate 310 is not limited thereto.

For example, when the substrate 310 has a structure of two or more layers, i.e., a multi-layered structure, the circuit portion may be provided on the first surface of the first area X that is the central portion of the substrate 310, and at least one or more resonance pattern portions 330 may be provided in the second area Y along the surrounding portion of the substrate 310, and in such case, there may be provided a via hole electrically connected with the circuit portion and allowing for electrical connection of the resonance pattern portions 330 provided on at least one or more layers.

As described above, one substrate 310 may be provided, the circuit portion having the receiving module 320 electrically connected with the resonance pattern portion 330 may be mounted at a side on a surface of the substrate 310, and the resonance pattern portion 330 may be mounted at an opposite side on the surface of the substrate 310. Thus, the process for the wireless power receiver 300 may be done on the single substrate 310. Further, the shield 340 may be mounted with the height of the electronic part such as the receiving module 320 implemented on the circuit portion.

Figure 17:
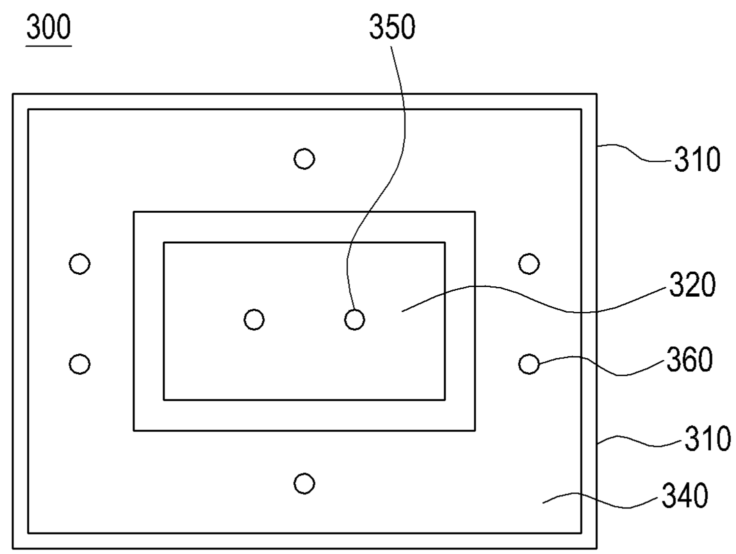
FIG. 17 is a plan view schematically illustrating a wireless power receiver having a substrate with a two-layered structure in a wireless power receiver according to an embodiment of the present disclosure.

Hereinafter, an example in which the first area X and the second area Y are implemented at two opposite sides, respectively, of the substrate 310 and the substrate 310 has a two-layered structure is described with reference to FIGS. 16 to 22. FIGS. 16 and 17 are views illustrating an example where the resonance pattern portion is provided on both surfaces of the circuit portion, and FIGS. 18 to 22 are views illustrating an example where the resonance pattern portion is provided on a surface of the substrate. Further, the above description applies to the same structure or configuration given above.

FIG. 16 is a view illustrating an example of a substrate with a two-layered structure where a circuit portion is provided on a first surface of a first area X of the substrate and a resonance pattern portion is mounted on both surfaces of a second area Y of the substrate in a wireless power receiver 300 according to an embodiment of the present disclosure.

FIG. 17 is a plan view schematically illustrating a wireless power receiver having a substrate with a two-layered structure in a wireless power receiver according to an embodiment of the present disclosure.

Referring to FIGS. 16 and 17, a substrate 310 may have a multi-layered structure, specifically a two-layered structure. The substrate 310 may have one dielectric layer 311 and metal layers 312 formed on both surfaces, respectively, of the dielectric layer 311 (in this embodiment, the top and bottom of the dielectric layer 311 or first and second surfaces of the dielectric layer 311, and the metal layer 312 formed on the top of the dielectric layer 311 is referred to as a first metal layer 312*a* and the metal layer 312 formed on the bottom of the dielectric layer 311 is referred to as a second metal layer 312*b*).

As described above, the substrate 310 may be partitioned into two areas, specifically, a first area X corresponding to a central portion inside the substrate 310 and a second area Y positioned around the first area X and corresponding to a surrounding portion of the substrate 310 as if the second area Y surrounds the first area X.

The circuit portion may be mounted in the first area X, specifically on the first metal layer 312*a* in the first area X of the substrate 310.

The resonance pattern portion 330 may include a first resonance pattern 331 mounted on the first metal layer 312*a* in the second area Y and a second resonance pattern 332 mounted on the second metal layer 312*b* in the second area Y.

Further, at least one or more first via holes 350 may be formed through the dielectric layer 311 in the first area X of the substrate 310 to electrically connect a first surface of the substrate 310 with a second surface of the substrate 310, which is an opposite surface of the first surface. The circuit portion may be disposed on both the top and bottom of the first area X.

At least one or more second via holes 360 may be provided through the dielectric layer 311 in the second area Y to electrically connect a first surface of the second area Y with a second surface of the second area Y, which is an opposite surface of the first surface, specifically the first metal layer 312*a*, the first resonance pattern 331 provided on the first metal layer 312*a*, the second metal layer 312*b*, and the second resonance pattern 332 provided on the second metal layer 312*b*.

The shield 340 may be provided on the first metal layer 312*a* along the surrounding portion of the receiving module 320 mounted on the circuit portion with respect to the receiving module 320 to shield magnetic fields generated by noise or eddy current for stable operation when power is applied to the first and second resonance patterns 331 and 332. The shield 340 may be implemented in the form of a film or may be formed of a material with higher permeability and low loss characteristics.

As described above, the circuit portion where the receiving module 320 electrically connected with the resonance pattern portion 330 is mounted is provided at the central portion of the first surface of the substrate 310, and the resonance pattern portion 330 is patterned on the surrounding side of the first surface of the substrate 310 and the second surface that is the opposite surface of the first surface. Thus, the process for the wireless power receiver 300 may be complete on the single substrate 310. Further, the shield 340 may be mounted with the height of the electronic part such as the receiving module 320 implemented on the circuit portion.

Hereinafter, an example in which the resonance pattern portion is positioned on at least one of a first surface of the dielectric layer or a second surface of the dielectric layer, which is an opposite surface of the first surface, is described with reference to FIGS. 18 to 22.

FIG. 18 is a view illustrating an example of a substrate with a two-layered structure where a circuit portion is provided on a first surface of a first area X of the substrate and a resonance pattern portion is mounted on a second surface of a second area Y of the substrate in a wireless power receiver according to an embodiment of the present disclosure.

Referring to FIG. 18, as described above in connection with FIG. 16, a substrate 310 may have a multi-layered structure, specifically a two-layered structure. The substrate 310 may have one dielectric layer 311 and metal layers 312 formed on both surfaces, respectively, of the dielectric layer 311 (in this embodiment, the top and bottom of the dielectric layer 311 or first and second surfaces of the dielectric layer 311, and the metal layer 312 formed on the top of the dielectric layer 311 is referred to as a first metal layer 312*a* and the metal layer 312 formed on the bottom of the dielectric layer 311 is referred to as a second metal layer 312*b*). Further, the substrate 310 may be partitioned into two areas, specifically, a first area X corresponding to a central portion inside the substrate 310, and a second area Y positioned around the first area X and corresponding to an opposite side of the substrate 310.

According to an embodiment of the present disclosure, the circuit portion may be mounted in the first area X in the first surface of the substrate 310, specifically on the first metal layer 312*a* in the first area X of the substrate 310. According to an embodiment of the present disclosure, the resonance pattern portion 330 may be provided on a second surface of the substrate 310, which is an opposite surface of the first surface of the substrate 310, specifically on the second metal layer 312*b* in the second area Y of the substrate 310. Further, as the second metal layer 312*b* and the resonance pattern portion 330 are positioned at a lower portion of the dielectric layer 311, a first via hole 350 may be implemented in the first area X to connect together the top and bottom of the substrate 310 so as to electrically connect with the circuit portion or the receiving module 320.

Further, the shield 340 may be provided on the first metal layer 312*a* to shield magnetic fields generated by noise or eddy current for stable operation when power is applied to the resonance pattern portion 330. The shield 340 may be implemented in the form of a film or may be formed of a material with higher permeability and low loss characteristics.

FIG. 19 is a view illustrating an example of a substrate with a two-layered structure where a circuit portion is provided on a first surface of a first area X of the substrate and a resonance pattern portion is mounted on a first surface of a second area Y of the substrate in a wireless power receiver according to an embodiment of the present disclosure.

Figure 20:
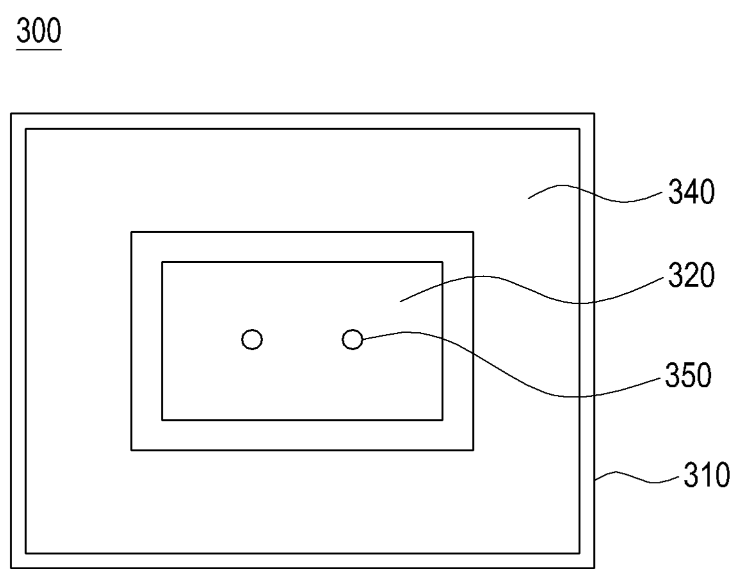
FIG. 20 is a plan view schematically illustrating a wireless power receiver according to an embodiment of the present disclosure.

FIG. 20 is a plan view schematically illustrating a wireless power receiver according to an embodiment of the present disclosure.

Referring to FIGS. 19 and 20, as described above in connection with FIG. 18, a substrate 310 may have a multi-layered structure, specifically a two-layered structure. The substrate 310 may have one dielectric layer 311 and metal layers 312 formed on both surfaces, respectively, of the dielectric layer 311 (in this embodiment, the top and bottom of the dielectric layer 311 or first and second surfaces of the dielectric layer 311, and the metal layer 312 formed on the top of the dielectric layer 311 is referred to as a first metal layer 312*a* and the metal layer 312 formed on the bottom of the dielectric layer 311 is referred to as a second metal layer 312*b*). Further, the substrate 310 may be partitioned into two areas, specifically, a first area X corresponding to a central portion of the substrate 310, and a second area Y corresponding to a surrounding portion of the first area X.

However, a difference from the wireless power receiver 300 described above in connection with FIG. 18 lies in the position where the resonance pattern portion 330 is mounted. In other words, according to an embodiment of the present disclosure, the circuit portion may be mounted in the first area X in the first surface of the substrate 310, specifically on the first metal layer 312*a* in the first area X of the substrate 310. Further, according to an embodiment of the present disclosure, the resonance pattern portion 330 may be provided on the first surface of the substrate 310, specifically on the first metal layer 312*a* in the second area Y of the substrate 310. Further, a first via hole 350 may be implemented in the first area X to connect together the top and bottom of the substrate 310 so as to electrically connect the circuit portion with the parts mounted on the second metal layer 312*b* in the first area X.

Further, the shield 340 may be provided on a surrounding portion of the first metal layer 312*a* of the substrate 310 outside the receiving module 320. That is, the shield 340 may be shaped as a doughnut having an empty space in the center thereof, with the receiving module 320 seated in the empty space. The shield 340 may be provided to shield magnetic fields generated by noise or eddy current for stable operation when power is applied to the resonance pattern portion 330. The shield 340 may be implemented in the form of a film or may be formed of a material with higher permeability and low loss characteristics.

FIG. 21 is a view illustrating an example of a substrate with a two-layered structure where a circuit portion is provided in a first area X of a first surface of the substrate and a resonance pattern portion is mounted on the top surface of a dielectric layer in a second area Y of the first surface of the substrate, with a metal layer removed, in a wireless power receiver according to an embodiment of the present disclosure.

Referring to FIG. 21, a substrate 310 may have a multi-layered structure, specifically a two-layered structure, as described above in connection with FIG. 16, and the substrate 310 may include a dielectric layer 311 and a metal layer 312. Particularly in the instant embodiment, the substrate 310 may have one dielectric layer 311.

The metal layer 312 may include a first metal layer 312*a* and a second metal layer 312*b* respectively formed on the first and second surfaces of the dielectric layer 311. The metal layers 312 may be provided on both surfaces of the first metal layer in the first area X positioned at a central portion of the substrate 310, and the metal layer 312 may be provided to be mounted on only one surface or opposite surface (in this embodiment, the bottom or opposite surface) in the second area Y of the substrate 310. That is, the second metal layer 312*b* mounted on the second surface of the substrate 310 may be stacked on the whole or partial second surface of the dielectric layer 311, and the first metal layer 312*a* mounted on the first surface of the substrate 310 may be stacked on the whole or partial first surface of the dielectric layer 311 at the position of the first area X. A look at the first surface of the substrate 310 shows that the first metal layer 312*a* may be stacked only at the central portion corresponding to the first area X of the dielectric layer 311, and the first metal layer 312*a* may be removed from the surrounding portion corresponding to the second area Y of the dielectric layer 311, exposing the top surface of the dielectric layer 311.

In this condition, the resonance pattern portion 330 may be immediately patterned on the top of the dielectric layer 311 in the second area Y where the first metal layer 312*a* has been removed.

According to an embodiment of the present disclosure, the circuit portion may be mounted in the first area X, specifically on the first metal layer 312*a* in the first area X. Further, the receiving module 320 may be mounted on the circuit portion, and a doughnut-shaped resonance pattern portion 330 may be mounted on the resonance pattern portion 330 patterned along the surrounding portion of the circuit portion.

The first via hole 350 may be provided through the dielectric layer 311 in the first area X to electrically connect the top and bottom of the substrate 310 in order to allow for electrical connection between the two metal layers with respect to the dielectric layer 311.

The shield 340 may be provided on the first metal layer 312*a* to shield magnetic fields generated by noise or eddy current for stable operation when power is applied to the resonance pattern portion 330. The shield 340 may be implemented in the form of a film or may be formed of a material with higher permeability and low loss characteristics.

FIG. 22 is a view illustrating an example of a substrate with a two-layered structure where a circuit portion is provided on a first surface of a first area X of the substrate and a resonance pattern portion is mounted on the metal layer provided on a second surface of a second area Y of the substrate in a wireless power receiver according to an embodiment of the present disclosure.

Referring to FIG. 22, a substrate 310 may have a multi-layered structure, specifically a two-layered structure, as described above in connection with FIG. 21, and the substrate 310 may include a dielectric layer 311 and a metal layer 312. According to an embodiment of the present disclosure, the substrate 310 may be partitioned into a first area X that is a central portion of the substrate 310 and has a circuit portion mounted therein and a second area Y that is a surrounding portion of the first area X and has a resonance pattern portion 330 mounted therein. A difference from the embodiment described above in connection with FIG. 21 lies in that, while in the above embodiment, the resonance pattern portion 330 is directly patterned on the surface of the dielectric layer 311 in the second area Y where the first metal layer 312*a* is removed as a first surface of the dielectric layer 311, the shield 340 is immediately mounted in the second area Y of the substrate 310 where the first metal layer 312*a* is removed, and the resonance pattern portion 330 is patterned on a second surface, which is an opposite surface of the first surface of the substrate 310, specifically in the second area Y of the second metal layer 312*b* in the instant embodiment.

Specifically, in the instant embodiment, one dielectric layer 311 may be provided, and metal layers 312 may be provided on both surfaces in the first area X positioned at a side of the substrate 310, and the metal layer 312 may be provided to be mounted on only one surface or opposite surface (in this embodiment, the bottom or opposite surface) in the second area Y of the substrate 310. That is, the metal layer 312 stacked on the top of the substrate 310 in the second area Y may be removed so that the metal layer 312 (hereinafter, the "first metal layer 312*a*") may be provided only in the first area X. In other words, a look at the top of the substrate 310 shows that the first metal layer 312*a* may be provided in the first area X, and the first metal layer 312*a* may be removed from the second area Y to expose the top surface of the dielectric layer 311. In this condition, the shield 340 may be provided on the top of the dielectric layer 311 in the second area Y where the first metal layer 312*a* has been removed. The second metal layer 312*b* may be provided on the whole or partial surface in the first area X and second area Y on the bottom of the substrate 310, and the resonance pattern portion 330 may be patterned on the surface of the second metal layer 312*b* in the second area Y, which is stacked on the bottom of the substrate 310, specifically the bottom of the dielectric layer 31.

The first metal layer 312*a* and the second metal layer 312*b* may be electrically connected with each other with respect to the dielectric layer 311, and the first via hole 350 may be provided through the top and bottom of the substrate 310 in the first area X to allow the resonance pattern portion 330 stacked on the bottom of the substrate 310 to be electrically connected with the receiving module 320 and the circuit portion.

Further, as set forth above, the shield 340 may be seated on the top of the dielectric layer 311 in the second area Y to shield magnetic fields generated by noise or eddy current for stable operation when the resonance pattern portion 330 is driven.

As shown in FIGS. 23 to 33, a multi-layered substrate may be provided which includes at least two or more dielectric layers or a plurality of dielectric layers and a plurality of metal layers. According to an embodiment, the substrate may have a four-layered structure for the purpose of description. Accordingly, the dielectric layers may include three layers, e.g., a first dielectric layer to a third dielectric layer, and the metal layers may include four metal layers stacked from the top of the first dielectric layer to the bottom of the third dielectric layer.

According to an embodiment of the present disclosure, the wireless power receiver may include a substrate, a circuit portion, a resonance pattern portion, and a shield. The configuration of the circuit portion, the resonance pattern portion, and the shield has been described above, and the above description may apply to specific configurations or functions thereof (refer to FIGS. 23 to 33).

As set forth above, according to an embodiment of the present disclosure, the substrate may include a plurality of dielectric layers and a plurality of metal layers stacked on the dielectric layers. According to an embodiment of the present disclosure, the circuit portion and the resonance pattern portion may together be mounted on the substrate. To that end, the substrate may be partitioned into a circuit portion mount area X where the circuit portion is mounted and a resonance pattern mount area Y where the resonance pattern portion 430 is mounted.

For example, as shown in FIGS. 23 to 33, the substrate may have a four-layered structure in which three dielectric layers and four metal layers are stacked. That is, the dielectric layers may include a first dielectric layer, a second dielectric layer, and a third dielectric layer on the top of the substrate, and a first metal layer, a second metal layer, a third metal layer, and a fourth metal layer may be stacked from the top of the first dielectric layer alternately with the dielectric layers. As described above, in the instant embodiment, the substrate has a four-layered structure for the purpose of description, but the structure of the substrate is not limited to such multi-layered structure or stacked structure. For example, the substrate may have a seven-layered structure or may have more layers.

Figure 23:
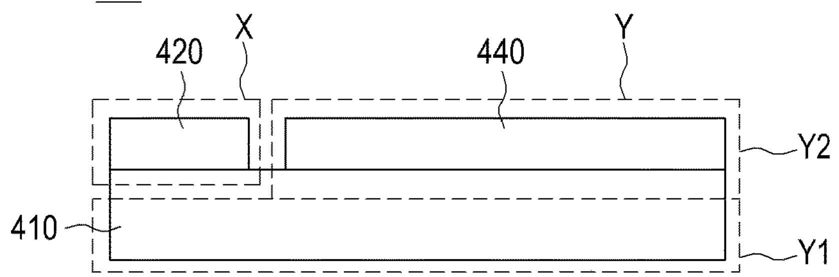
FIG. 23 is a view schematically illustrating a wireless power receiver having a multi-layered substrate, a circuit portion mount area, and a resonance pattern mount area according to an embodiment of the present disclosure.
Figure 24:
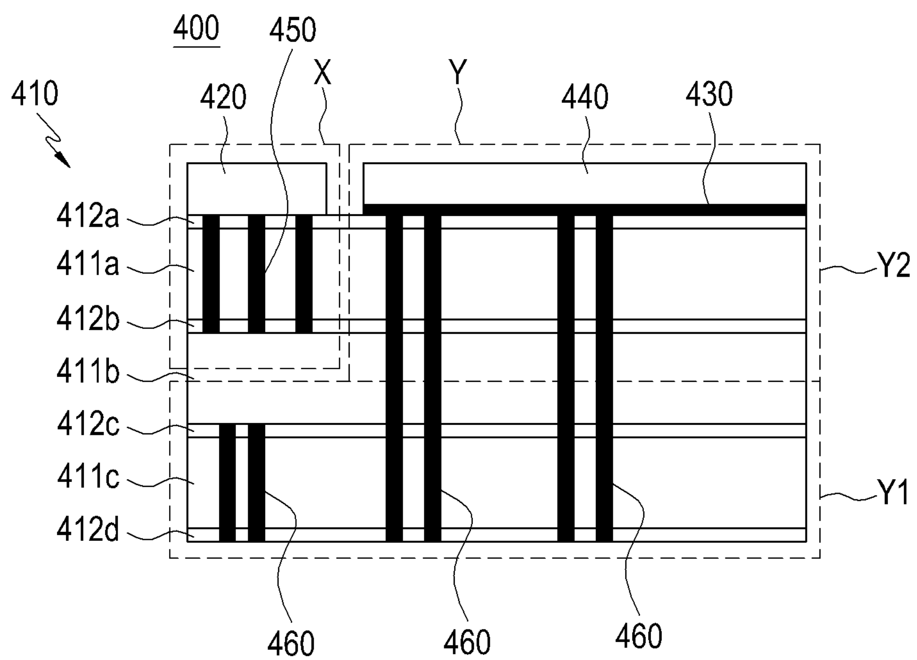
FIG. 24 is a cross-sectional view illustrating a wireless power receiver having a multi-layered substrate, a circuit portion mount area, and a resonance pattern mount area according to an embodiment of the present disclosure.
Figure 25:
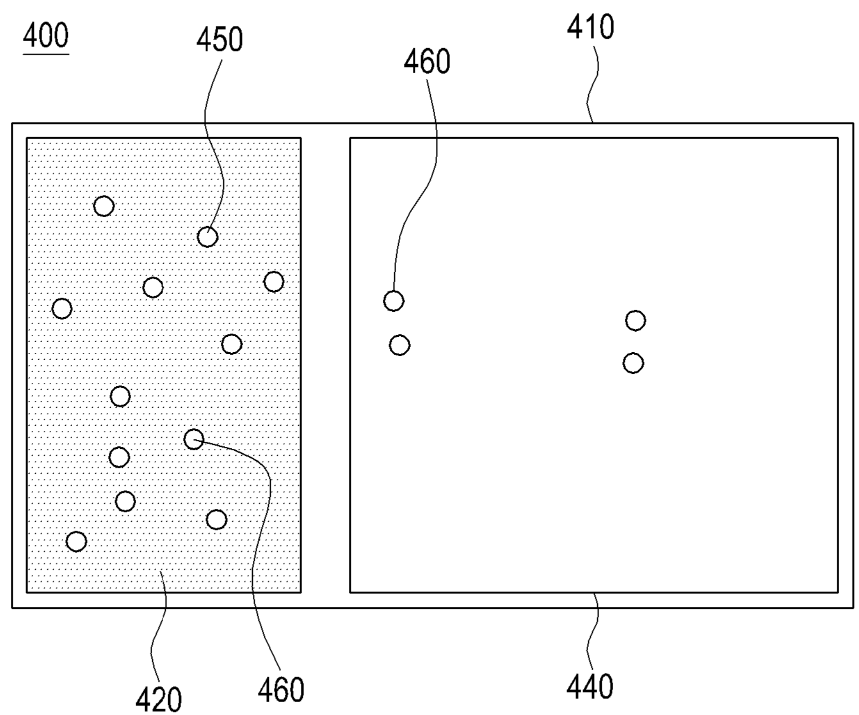
FIG. 25 is a plan view schematically illustrating a wireless power receiver according to an embodiment of the present disclosure.

First, as shown in FIGS. 23 to 25, a wireless power receiver having the multi-layered substrate, the circuit portion mount area X and the resonance pattern mount area Y is described according to an embodiment of the present disclosure.

FIG. 23 is a view schematically illustrating a wireless power receiver having a multi-layered substrate, a circuit portion mount area X, and a resonance pattern mount area Y according to an embodiment of the present disclosure.

FIG. 24 is a cross-sectional view schematically illustrating a wireless power receiver having a multi-layered substrate, a circuit portion mount area X, and a resonance pattern mount area Y according to an embodiment of the present disclosure.

FIG. 25 is a plan view schematically illustrating a wireless power receiver according to an embodiment of the present disclosure.

Referring to FIGS. 23 to 25, a wireless power receiver 400 may be implemented with three dielectric layers 411 and four metal layers 412 stacked alternately. Specifically, the dielectric layers 411 may include, from top to down, a first dielectric layer 411*a*, a second dielectric layer 411*b*, and a third dielectric layer 411*c*. The first metal layer 412*a* to the fourth metal layer 412*d* may alternately be stacked from the top of the first dielectric layer 411*a* to the bottom of the third dielectric layer 411*c*.

A circuit portion and a resonance pattern portion 430 may together be implemented on a substrate 410 having such stack. That is, the substrate 410 may be partitioned into a circuit portion mount area X where the circuit portion having a receiving module 420 is provided and a resonance pattern mount area Y where the resonance pattern portion 430 is provided.

According to an embodiment of the present disclosure, the circuit portion mount area X may be positioned at a side on the top of the substrate 410. Specifically, the circuit portion mount area X may be an area positioned at a side of the first dielectric layer 411*a* and the first and second metal layers 412*a* and 412*b* disposed on the top and bottom of the first dielectric layer 411*a*.

According to an embodiment of the present disclosure, the resonance pattern mount area Y may be an area positioned adjacent to the circuit portion mount area X, i.e., an area including the other side and bottom area of the circuit portion mount area X. The resonance pattern mount area Y may include a first section Y1 that is a lower portion of the substrate 410 and a second section Y2 that is an upper portion at another side of the substrate 410. Specifically, the first section Y1 may be the overall area of the third dielectric layer 411*c* and the third and fourth metal layers 412 provided on the top and bottom of the third dielectric layer 411*c*, and the second section Y2 may be an area at another side of the first metal layer 412*a*, the first dielectric layer 411*a*, the second metal layer 412*b*, and the second dielectric layer 411*b*. That is, the resonance pattern mount area may be overall, substantially, L-shaped.

The circuit portion mount area X may have at least one or more first via holes 450 formed through the dielectric layers 411 to electrically connect the circuit portion provided on the metal layers 412. Further, the resonance pattern mount area Y may have a second via hole 460 to electrically connect the resonance pattern portion 430 disposed in the first section Y1 with the resonance pattern portion 430 disposed in the second section Y2.

That is, as viewed from the first section Y1, a plurality of second via holes 460 (hereinafter, referred to as 2Ath via holes) may be formed through the third dielectric layer 411*c* to connect the third metal layer 412*c* with the fourth metal layer 412*d*. Further, as viewed from the second section Y2, a second via hole 460 (hereinafter, referred to as a 2Bth via hole) may be formed through the first dielectric layer 411*a* to electrically connect the first and second metal layers 412*a* and 412*b*, through the second dielectric layer 411*b* to electrically connect the second and third metal layers 412*c* and 412*d*, and through the third dielectric layer 411*c* to electrically connect the third and fourth metal layers 412*c* and 412*d*.

Further, the shield 440 may be provided on the surface of the first metal layer 412*a* at another side of the circuit portion where the receiving module 420 is provided.

As described above, since the circuit portion having the receiving module 420 and the resonance pattern portion 430 may together be provided on the same board also in the multi-layered substrate 410, the process for the wireless power receiver 400 may be complete on the single substrate 410. Further, the shield 440 may be mounted with the height of the electronic part such as the receiving module 420 implemented on the circuit portion.

Figure 26:
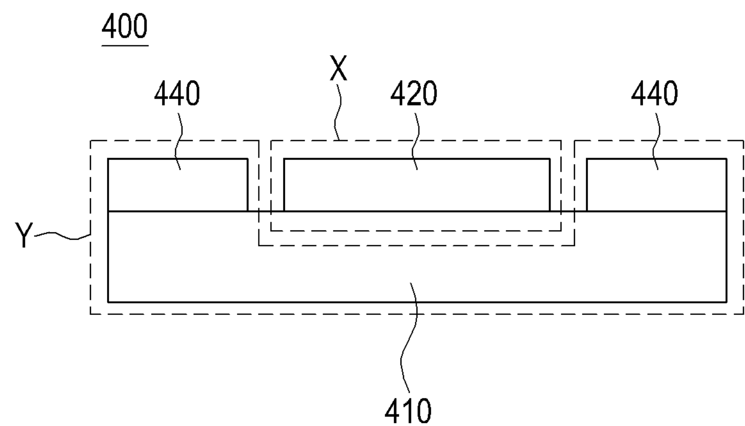
FIG. 26 is a view schematically illustrating a wireless power receiver having a multi-layered substrate, a circuit portion mount area, and a resonance pattern mount area according to an embodiment of the present disclosure.

FIG. 26 is a view schematically illustrating a wireless power receiver having a multi-layered substrate, a circuit portion mount area X, and a resonance pattern mount area Y according to an embodiment of the present disclosure.

FIG. 27 is a cross-sectional view schematically illustrating a wireless power receiver having a multi-layered substrate, a circuit portion mount area X, and a resonance pattern mount area Y according to an embodiment of the present disclosure.

Referring to FIGS. 26 and 27, a wireless power receiver 400 may be implemented with three dielectric layers 411 and four metal layers 412 stacked alternately. Specifically, the dielectric layers 411 may include, from top to down, a first dielectric layer 411*a*, a second dielectric layer 411*b*, and a third dielectric layer 411*c*. The first metal layer 412*a* to the fourth metal layer 412*d* may alternately be stacked from the top of the first dielectric layer 411*a* to the bottom of the third dielectric layer 411*c*.

The circuit portion and the resonance pattern portion 430 may together be implemented on the substrate 410 having such stack. That is, the substrate 410 may be partitioned into a circuit portion mount area X where the circuit portion having a receiving module 420 is provided and a resonance pattern mount area Y where the resonance pattern portion 430 is provided.

Here, a difference between the instant embodiment and the embodiment described above in connection with FIGS. 23 to 25 is the position of the circuit portion mount area X and the resonance pattern mount area Y.

Specifically, according to an embodiment of the present disclosure, the circuit portion mount area X may be positioned at an upper portion inside the substrate 410. Specifically, the circuit portion mount area X may be an area positioned at a central portion of the first dielectric layer 411*a* and the first and second metal layers 412*a* and 412*b* disposed on the top and bottom of the first dielectric layer 411*a*.

According to an embodiment of the present disclosure, the resonance pattern mount area Y may be an area positioned adjacent to the circuit portion mount area X and may include a first section Y1 that is a lower portion of the substrate 410 and a second section Y2 that is an upper, surrounding portion inside the substrate 410.

Specifically, the first section Y1 may be the overall area of the third dielectric layer 411*c* and the third and fourth metal layers 412*c* and 412*d* provided on the top and bottom of the third dielectric layer 411*c*, and the second section Y2 may be an upper, surrounding area inside the substrate 410 and a surrounding area of the first metal layer 412*a*, the first dielectric layer 411*a*, the second metal layer 412*b*, and the second dielectric layer 411*b*.

The resonance pattern mount area Y may be substantially shaped as the letter "U."

The circuit portion mount area X may have at least one or more first via holes 450 formed through the dielectric layers 411 to electrically connect the circuit portion provided on the metal layers 412. Further, the resonance pattern mount area Y may have a second via hole 460 to electrically connect the resonance pattern portion 430 disposed in the first section Y1 with the resonance pattern portion 430 disposed in the second section Y2.

That is, as viewed from the first section Y1, a second via hole 460 (hereinafter, referred to as a 2Ath via hole) may be formed through the third dielectric layer 411*c* to connect the third metal layer 412*c* with the fourth metal layer 412*d*. Further, as viewed from the second section Y2, a second via hole 460 (hereinafter, referred to as a 2Bth via hole) may be formed through the first dielectric layer 411*a* to electrically connect the first and second metal layers 412*a* and 412*b*, through the second dielectric layer 411*b* to electrically connect the second and third metal layers 412*c* and 412*d*, and through the third dielectric layer 411*c* to electrically connect the third and fourth metal layers 412*c* and 412*d*.

Further, the shield 440 may be provided on the surface of the first metal layer 412*a* at another side of the circuit portion where the receiving module 420 is provided.

As described above, since the circuit portion having the receiving module 420 and the resonance pattern portion 430 may together be provided on the same board also in the multi-layered substrate 410, the process for the wireless power receiver 400 may be complete on the single substrate 410. Further, the shield 440 may be mounted with the height of the electronic part such as the receiving module 420 implemented on the circuit portion.

FIG. 28 is a view schematically illustrating a wireless power receiver having a multi-layered substrate, a circuit portion mount area X, and a resonance pattern mount area Y according to an embodiment of the present disclosure.

FIG. 29 is a cross-sectional view schematically illustrating a wireless power receiver having a multi-layered substrate, a circuit portion mount area X, and a resonance pattern mount area Y according to an embodiment of the present disclosure.

FIG. 30 is a plan view schematically illustrating a wireless power receiver having a multi-layered substrate, a circuit portion mount area X, and a resonance pattern mount area Y according to an embodiment of the present disclosure.

Referring to FIGS. 28 to 30, a wireless power receiver 400 may be implemented with three dielectric layers 411 and four metal layers 412 stacked alternately. Specifically, the dielectric layers 411 may include, from top to down, a first dielectric layer 411*a*, a second dielectric layer 411*b*, and a third dielectric layer 411*c*. The first metal layer 412*a* to the fourth metal layer 412*d* may alternately be stacked from the top of the first dielectric layer 411*a* to the bottom of the third dielectric layer 411*c*. The circuit portion and the resonance pattern portion 430 may together be implemented on the substrate 410 having such stack. Here, a difference between the instant embodiment and the embodiment described above in connection with FIGS. 23 to 25 lies in whether there are some metal layers 412 and the position of the resonance pattern mount area Y. That is, as shown in FIGS. 23 to 25, the first, second, third, and fourth metal layers 412*a*, 412*b*, 412*c*, and 412*d* are structured to be stacked on the whole or part of the overall surface of the first, second, and third dielectric layers 411*a*, 411*b*, and 411*c*. By contrast, a look at the first, second, third, and fourth metal layers 412*a*, 412*b*, 412*c*, and 412*d* according to the instant embodiment shows that the third and fourth metal layers 412*c* and 412*d* are stacked on the whole or part of the overall surface of the third dielectric layer 411*c* while the first and second metal layers 412*a* and 412*b* are provided on the top and bottom of the first dielectric layer 411*a* only in the circuit portion mount area X, i.e., only at a side of the first dielectric layer 411*a* and removed from the other side of the first dielectric layer 411*a*.

According to an embodiment of the present disclosure, the first metal layer 412*a* and the second metal layer 412*b* are provided at a side on the top and bottom of the first dielectric layer 411*a* only in the circuit portion mount area X and removed from the other side on the top and bottom of the first dielectric layer 411*a*, so that the first and second metal layers 412*a* and 412*b* are not stacked in the second section Y2 as described below.

Further, the resonance pattern portion 430 may be implemented on at least one surface of the lowermost dielectric layer (the third dielectric layer 411*c*) and the third and fourth metal layers 412*c* and 412*d* stacked on the top and bottom of the third dielectric layer 411*c* so that an overall or partial lower portion of the substrate 410 may be implemented as the resonance pattern mount area.

According to an embodiment of the present disclosure, the circuit portion mount area X may be positioned at an upper portion at a side of the substrate 410. Specifically, the circuit portion mount area X may be an area positioned at a side of the first dielectric layer 411*a* and the first and second metal layers 412*a* and 412*b* disposed on the top and bottom of the first dielectric layer 411*a*.

According to an embodiment of the present disclosure, the resonance pattern mount area Y may be a lower portion of the circuit portion mount area X, i.e., the first section Y1 in the lower portion of the substrate 410. That is, the area is the overall area of the third dielectric layer 411*c* and the third and fourth metal layers 412*c* and 412*d* provided on the top and bottom of the third dielectric layer 411*c*. That is, as shown in FIGS. 23 to 25, the resonance pattern portion 430 is not mounted in the second section Y2. In the embodiment, although the resonance pattern portion 430 is mounted in the first section Y1 but not in the second section Y2, its opposite structure may be implemented as well. That is, for example, an electronic part may be mounted in the first section Y1, and the resonance pattern portion 430 may be mounted on at least one surface of the top and bottom of the first dielectric layer 411*a* or the top of the second dielectric layer 411*b* in the second section Y2.

The circuit portion mount area X may have at least one or more first via holes 450 formed through the dielectric layers 411 to electrically connect the circuit portion provided on the metal layers 412. Further, the resonance pattern mount area Y may have a second via hole 460 to electrically connect the resonance pattern portion 430 disposed in the first section Y1 with the resonance pattern portion 430 disposed in the second section Y2.

That is, as viewed from the first section Y1, a plurality of second via holes 460 may be formed through the third dielectric layer 411*c* to connect the third metal layer 412*c* with the fourth metal layer 412*d*.

Further, the shield 440 may be provided on the surface of the first metal layer 412*a* at another side of the circuit portion where the receiving module 420 is provided.

As described above, since the circuit portion having the receiving module 420 and the resonance pattern portion 430 may together be provided on the same board also in the multi-layered substrate 410, the wireless power receiver 400 may be formed on the single substrate 410. Further, the shield 440 may be mounted with the height of the electronic part such as the receiving module 420 implemented on the circuit portion.

FIG. 31 is a view schematically illustrating a wireless power receiver having a multi-layered substrate, a circuit portion mount area X, and a resonance pattern mount area Y according to an embodiment of the present disclosure.

FIG. 32 is a cross-sectional view schematically illustrating a wireless power receiver having a multi-layered substrate, a circuit portion mount area X, and a resonance pattern mount area Y according to an embodiment of the present disclosure.

Referring to FIGS. 31 and 32, a wireless power receiver 400 may be implemented with three dielectric layers 411 and four metal layers 412 stacked alternately. Specifically, the dielectric layers 411 may include, from top to down, a first dielectric layer 411*a*, a second dielectric layer 411*b*, and a third dielectric layer 411*c*. The first metal layer 412*a* to the fourth metal layer 412*d* may alternately be stacked from the top of the first dielectric layer 411*a* to the bottom of the third dielectric layer 411*c*.

The circuit portion and the resonance pattern portion 430 may together be implemented on the substrate 410 having such stack. Here, a difference between the instant embodiment and the embodiment described above in connection with FIGS. 26 and 27 lies in whether there are some metal layers 412 and the position of the resonance pattern mount area Y. That is, as shown in FIGS. 26 and 27, the first, second, third, and fourth metal layers 412*a*, 412*b*, 412*c*, and 412*d* are structured to be stacked on the whole or part of the overall surface of the first, second, and third dielectric layers 411*a*, 411*b*, and 411*c*. By contrast, a look at the first, second, third, and fourth metal layers 412*a*, 412*b*, 412*c*, and 412*d* according to the instant embodiment shows that the third and fourth metal layers 412*c* and 412*d* are stacked on the whole or part of the overall surface of the third dielectric layer 411*c* while the first and second metal layers 412*a* and 412*b* are provided on the top and bottom of the first dielectric layer 411*a* only in the circuit portion mount area X, i.e., only at a central portion inside the first dielectric layer 411*a* and removed from the surrounding portion on the top and bottom of the first dielectric layer 411*a*.

According to an embodiment of the present disclosure, the first metal layer 412*a* and the second metal layer 412*b* are provided at an inside central portion on the top and bottom of the first dielectric layer 411*a* only in the circuit portion mount area X, and the first and second metal layers 412*a* and 412*b* at the surrounding portion on the top and bottom of the first dielectric layer 411*a* are removed from the other side on the top and bottom of the first dielectric layer 411*a*, so that the first and second metal layers 412*a* and 412*b* are not stacked in the second section Y2 as described below.

Further, the resonance pattern portion 430 may be implemented on at least one surface of the lowermost dielectric layer (the third dielectric layer 411*c*) and the third and fourth metal layers 412*c* and 412*d* stacked on the top and bottom of the third dielectric layer 411*c* so that an overall or partial lower portion of the substrate 410 may be implemented as the resonance pattern mount area Y.

According to an embodiment of the present disclosure, the circuit portion mount area X may be positioned at an upper portion at a side of the substrate 410. Specifically, the circuit portion mount area X may be an area positioned at an inside, central portion of the first dielectric layer 411*a* and the first and second metal layers 412*a* and 412*b* disposed on the top and bottom of the first dielectric layer 411*a*.

According to an embodiment of the present disclosure, the resonance pattern mount area Y may be a lower portion of the circuit portion mount area X, i.e., the first section Y1 in the lower portion of the substrate 410. That is, the area is the overall area of the third dielectric layer 411*c* and the third and fourth metal layers 412*c* and 412*d* provided on the top and bottom of the third dielectric layer 411*c*. That is, as shown in FIGS. 23 to 25, the resonance pattern portion 430 is not mounted in the second section Y2. In the embodiment, although the resonance pattern portion 430 is mounted in the first section Y1 but not in the second section Y2, its opposite structure may be implemented as well. That is, for example, an electronic part may be mounted in the first section Y1, and the resonance pattern portion 430 may be mounted on at least one surface of the top and bottom of the first dielectric layer 411*a* or the top of the second dielectric layer 411*b* in the second section Y2.

The circuit portion mount area X may have at least one or more first via holes 450 formed through the dielectric layers 411 to electrically connect the circuit portion provided on the metal layers 412. Further, the resonance pattern mount area Y may have a second via hole 460 to electrically connect the resonance pattern portion 430 disposed in the first section Y1 with the resonance pattern portion 430 disposed in the second section Y2.

That is, as viewed from the first section Y1, a plurality of second via holes 460 may be formed through the third dielectric layer 411*c* to connect the third metal layer 412*c* with the fourth metal layer 412*d*.

Further, the shield 440 may be provided on the surface of the first metal layer 412*a* at another side of the circuit portion where the receiving module 420 is provided.

As described above, since the circuit portion having the receiving module 420 and the resonance pattern portion 430 may together be provided on the same board also in the multi-layered substrate 410, the wireless power receiver 400 may be formed on the single substrate 410. Further, the shield 440 may be mounted with the height of the electronic part such as the receiving module 420 implemented on the circuit portion.

While the present disclosure has been shown and described with reference to various embodiments thereof, it will be understood by those skilled in the art that various changes in form and detail may be made therein without departing from the spirit and scope of the present disclosure as defined by the appended claims and their equivalents.

What is claimed is:

1. A wireless power receiver comprising:

a substrate partitioned into a first area and a second area neighboring the first area, wherein the substrate includes at least one dielectric layer and a first metal layer stacked on a first surface of the at least one dielectric layer in the first area except the second area, and a second metal layer stacked on a second surface of the at least one dielectric layer being opposite to the first surface of the at least one dielectric layer;

a circuit portion mounted in the first area of the substrate and including a receiving component, the receiving component having a predetermined height;

a resonance pattern portion patterned on the first surface of the at least one dielectric layer of the substrate in the second area; and a shield having a height corresponding to the predetermined height of the receiving component, and mounted on the first surface of the at least one dielectric layer of the substrate in the second area.

2. The wireless power receiver of claim 1, wherein the substrate is provided in at least one of a single-layered or multi-layered structure depending on a stacking of the at least one dielectric layer and at least one of the first metal layer and the second metal layer.

3. The wireless power receiver of claim 2, wherein the first area is positioned at a first side of the substrate, and the second area is positioned at a second side of the substrate neighboring the first area.

4. The wireless power receiver of claim 3, wherein the substrate further comprises a single-layered structure having one dielectric layer and the metal layer stacked on the one dielectric layer, wherein the circuit portion is provided on a surface of the metal layer in the first area, and wherein the resonance pattern portion is provided on the surface of the metal layer in the second area and neighbors the circuit portion.

5. The wireless power receiver of claim 3, wherein the substrate further comprises a two-layered structure having one dielectric layer and the first metal layer stacked on the first surface of the one dielectric layer and the second metal layer stacked on the second surface of the one dielectric layer, the second surface of the one dielectric layer being opposite to the first surface of the one dielectric layer, wherein the circuit portion is provided in the first area stacked on the first surface of the one dielectric layer, and wherein a first resonance pattern portion is provided in the second area on the first surface of the one dielectric layer and a second resonance pattern portion is provided in the second area on the second surface of the one dielectric layer.

6. The wireless power receiver of claim 5, wherein at least one first via hole is provided through the one dielectric layer in the first area to electrically connect the first surface of the one dielectric layer and the second surface of the one dielectric layer, and wherein at least one second via hole is provided through the one dielectric layer in the second area.

7. The wireless power receiver of claim 3, wherein the resonance pattern portion is patterned on an upper surface of one dielectric layer.

8. The wireless power receiver of claim 3, layer, and wherein the resonance pattern portion is patterned on a surface of the second metal layer.

9. The wireless power receiver of claim 3, wherein at least one first via hole is provided through one dielectric layer in the first area electrically connecting an upper surface of the substrate and a lower surface of the substrate.

10. The wireless power receiver of claim 2, wherein the first area is positioned at a middle portion of the substrate, and wherein the second area is positioned at a surrounding portion of the substrate that surrounds the first area.

11. The wireless power receiver of claim 10, wherein the substrate comprises a two-layered structure having one dielectric layer, and the first metal layer and the second metal layer are respectively stacked on opposite surfaces of the one dielectric layer, wherein the circuit portion is provided in the first area of the first surface of the substrate, and wherein the resonance pattern portion further comprises a first resonance pattern portion provided in the second area of a first surface of the one dielectric layer and a second resonance pattern portion provided in the second area of a second surface of the one dielectric layer opposite to the first surface of the one dielectric layer.

12. The wireless power receiver of claim 11, wherein at least one first via hole is provided through the one dielectric layer in the first area electrically connecting the first surface of the one dielectric layer and the second surface of the one dielectric layer, and wherein at least one second via hole is provided through the one dielectric layer in the second area.

13. The wireless power receiver of claim 10, wherein the resonance pattern portion is patterned on an upper surface of one dielectric layer.

14. The wireless power receiver of claim 10, wherein the resonance pattern portion is patterned on a surface of the second metal layer.

15. The wireless power receiver of claim 10, wherein at least one first via hole is provided through one dielectric layer in the first area electrically connecting an upper surface of the substrate and a lower surface of the substrate.

16. The wireless power receiver of claim 1, wherein the resonance pattern portion comprises an antenna pattern formed as conductive lines with a preset pattern, and wherein each of the conductive lines comprises a predetermined line width.

17. The wireless power receiver of claim 1, wherein the shield is not provided in the first area, and wherein the shield is further configured to:

shield only magnetic fields generated in the second area, and provide no shielding for the first area.

* * * * *